United States Patent
Tonaru

(10) Patent No.: US 11,622,442 B2
(45) Date of Patent: Apr. 4, 2023

(54) CIRCUIT MEMBER JOINT STRUCTURE AND CIRCUIT MEMBER JOINING METHOD

(71) Applicant: Murata Manufacturing Co., Ltd., Nagaokakyo (JP)

(72) Inventor: Daisuke Tonaru, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 17/109,182

(22) Filed: Dec. 2, 2020

(65) Prior Publication Data
US 2021/0092832 A1 Mar. 25, 2021

Related U.S. Application Data

(63) Continuation of application No. PCT/JP2019/024036, filed on Jun. 18, 2019.

(30) Foreign Application Priority Data

Jun. 19, 2018 (JP) .............................. JP2018-116219
Aug. 31, 2018 (JP) .............................. JP2018-162259

(51) Int. Cl.
*H05K 1/02* (2006.01)
*H05K 1/11* (2006.01)
(Continued)

(52) U.S. Cl.
CPC ........... *H05K 1/0271* (2013.01); *H01L 24/05* (2013.01); *H05K 1/14* (2013.01); *H05K 3/28* (2013.01);
(Continued)

(58) Field of Classification Search
CPC .......... H05K 1/0271; H05K 1/14; H05K 3/28; H05K 3/34; H05K 1/0222;
(Continued)

(56) References Cited

U.S. PATENT DOCUMENTS 5,997,983 A * 12/1999 Caron .................. H05K 1/0366
442/232
6,078,229 A 6/2000 Funada et al.
6,809,260 B1 * 10/2004 Prokofiev .............. H05K 1/145
361/728

(Continued)

FOREIGN PATENT DOCUMENTS

JP 11-55066 A 2/1999
JP 2003-249603 A 9/2003
(Continued)

OTHER PUBLICATIONS

Machine translation: JP2017034224A.*
Official Communication issued in International Patent Application No. PCT/JP2019/024036, dated Aug. 6, 2019.

*Primary Examiner* — Ishwarbhai B Patel
(74) *Attorney, Agent, or Firm* — Keating & Bennett, LLP

(57) ABSTRACT

A circuit member joint structure includes a first circuit member including a first main surface on which a first mounting electrode is provided, a second circuit member including a second main surface on which a second mounting electrode is provided, a conductive joining material with which the first mounting electrode and the second mounting electrode are joined to each other, and an insulating joining material with which an end portion of the first circuit member and an end portion of the second circuit member are joined to each other. The first circuit member includes a first recess on the first main surface and spaced away from the first mounting electrode, and at least a portion of the insulating joining material is disposed in the first recess.

27 Claims, 13 Drawing Sheets

(51) Int. Cl.
*H05K 1/14* (2006.01)
*H01L 23/00* (2006.01)
*H05K 3/28* (2006.01)
*H05K 3/34* (2006.01)
*H05K 1/18* (2006.01)
*H05K 1/03* (2006.01)

(52) U.S. Cl.
CPC ............. *H05K 3/34* (2013.01); *H05K 1/0277* (2013.01); *H05K 1/0393* (2013.01); *H05K 1/111* (2013.01); *H05K 1/18* (2013.01)

(58) Field of Classification Search
CPC .......... H05K 2201/09618; H05K 2201/10189; H05K 3/363; H01L 24/05
See application file for complete search history.

(56) References Cited

U.S. PATENT DOCUMENTS

| | | | | |
|---|---|---|---|---|
| 7,652,366 B2 * | 1/2010 | Chung | ................ | G02F 1/13452 257/737 |
| 2003/0211234 A1 * | 11/2003 | Kurita | .................... | H05K 3/361 29/830 |
| 2007/0277998 A1 * | 12/2007 | Suzuki | ................. | H05K 3/4691 174/255 |
| 2008/0251280 A1 * | 10/2008 | Shi | ......................... | H05K 3/363 156/60 |
| 2008/0289859 A1 * | 11/2008 | Mikado | ................. | H05K 3/4691 427/98.5 |
| 2010/0007033 A1 | 1/2010 | Kitae et al. | | |
| 2010/0193223 A1 * | 8/2010 | Bagung | ................. | H05K 1/0278 174/254 |
| 2017/0278819 A1 | 9/2017 | Kawamura et al. | | |

FOREIGN PATENT DOCUMENTS

| | | |
|---|---|---|
| JP | 2005-005435 A | 1/2005 |
| JP | 2010-045330 A | 2/2010 |
| JP | 2016-174317 A | 9/2016 |
| JP | 2017-034224 A | 2/2017 |
| JP | 2017-175018 A | 9/2017 |

* cited by examiner

CIRCUIT MEMBER JOINT STRUCTURE AND CIRCUIT MEMBER JOINING METHOD

CROSS REFERENCE TO RELATED APPLICATIONS

This application claims the benefit of priority to Japanese Patent Application No. 2018-162259 filed on Aug. 31, 2018 and Japanese Patent Application No. 2018-116219 filed on Jun. 19, 2018, and is a Continuation Application of PCT Application No. PCT/JP2019/024036 filed on Jun. 18, 2019. The entire contents of each application are hereby incorporated herein by reference.

BACKGROUND OF THE INVENTION

1. Field of the Invention

The present invention relates to a joint structure with which a plurality of circuit members are physically joined to each other while being electrically connected to each other.

2. Description of the Related Art

Japanese Patent Application Laid-Open No. 2005-5435 discloses a configuration in which an element and a conductor pattern are joined to each other by using a conductive bump. In the configuration of Japanese Patent Application Laid-Open No. 2005-5435, the joint area provided using the conductive bump is extremely small as compared with the facing area between the element and the conductor pattern. Therefore, in order to increase the joint strength between the element and the conductor pattern, an insulating underfill resin is filled between the element and the conductor pattern.

Unfortunately, when both an insulating joining material and a conductive joining material are provided between a plurality of circuit members to be joined to each other as in the joining mode disclosed Japanese Patent Application Laid-Open No. 2005-5435 where the insulating underfill resin the conductive bump are used, the reliability of the physical joining and the electrical connection might be compromised. The reliability particularly tends to be compromised under a condition where a joint portion receives stress.

SUMMARY OF THE INVENTION

Preferred embodiments of the present invention provide circuit member joint structures that are each able to ensure the reliability of physical joining between a plurality of circuit members, while ensuring electrical connection therebetween.

A circuit member joint structure according to a preferred embodiment of the present invention includes a first circuit member including a first main surface on which a first mounting electrode is provided, a second circuit member including a second main surface on which a second mounting electrode is provided, a conductive joining material with which the first mounting electrode and the second mounting electrode are joined to each other, and an insulating joining material with which an end portion of the first circuit member and an end portion of the second circuit member are joined to each other. The first circuit member includes a first recess that is on the first main surface and is separated from the first mounting electrode, and at least a portion of the insulating joining material is accommodated in the first recess.

With this configuration, unwanted excessive spreading of the insulating joining material between the first main surface and the second main surface is prevented, and physical joining between the first main surface and the second main surface is achieved. Thus, the joint between the insulating joining material and the conductive joining material is prevented from being adversely affected, and reliability of the joint between the first circuit member and the second circuit member is ensured.

With preferred embodiments of the present invention, high reliability of electrical connection between a plurality of circuit members and high reliability of physical joining between a plurality of circuit members are able to be ensured.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will be described in detail below with reference to the drawings.

First Preferred Embodiment

Figure 1:
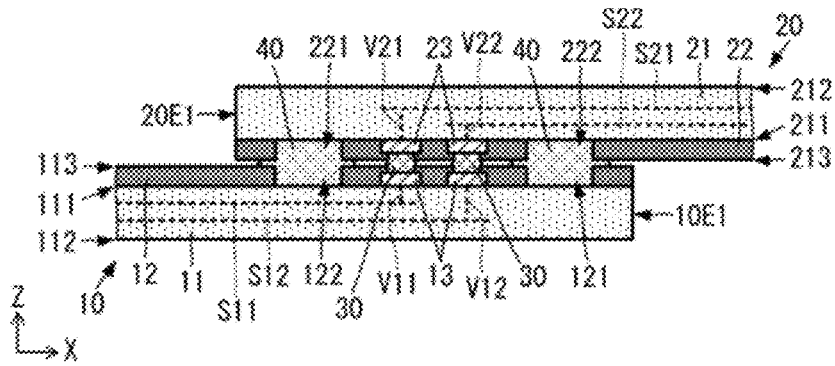
FIG. 1 is a side sectional view of a joint structure for circuit members 10 and 20, according to a first preferred embodiment of the present invention.
Figure 2A:
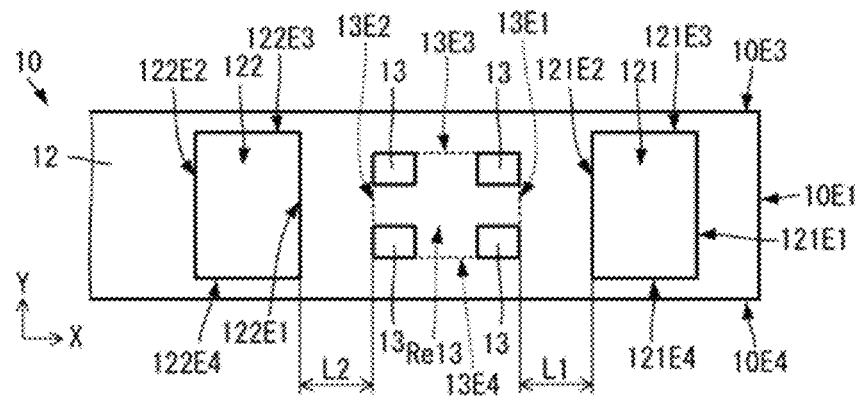
FIG. 2A is a plan view illustrating the configuration of a joint portion in the circuit member 10.
Figure 2B:
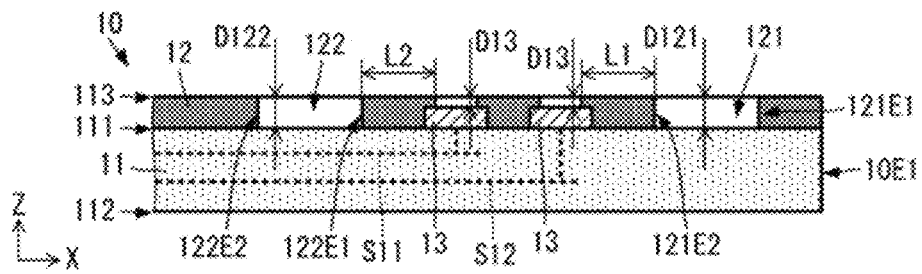
FIG. 2B is a side sectional view of the same.

A circuit member joint structure and a circuit member joining method according to a first preferred embodiment of the present invention will be described with reference to the drawings. FIG. 1 is a side sectional view of a joint structure for circuit members 10 and 20, according to the first preferred embodiment. FIG. 2A is a plan view illustrating a configuration of a joint portion in the circuit member 10, and FIG. 2B is a side sectional view of the same.

The circuit member joint structure illustrated in FIG. 1 includes the circuit member 10 and the circuit member 20. The joint structure of the circuit members 10 and 20 further includes a conductive joining material 30 and an insulating joining material 40. The circuit member 10 corresponds to a "first circuit member", and the circuit member 20 corresponds to a "second circuit member".

The circuit member 10 and the circuit member 20 are, for example, circuit boards. The circuit member 10 and the circuit member 20 can be joined to each other to be one discrete circuit member. For example, with the circuit member 10 and the circuit member 20 each having a longitudinal direction joined to each other, a circuit member longer than each of the circuit member 10 and the circuit member 20 can be obtained.

Structure of Joint Portion of Circuit Board

The portions of the circuit member 10 and the circuit member 20 to be joined to each other have the same or substantially the same structure, and thus a configuration of the circuit member 10 will be described below with reference to FIGS. 2A and 2B.

The circuit member 10 includes a flat plate-shaped substrate 11. As illustrated in FIGS. 1, 2A, and 2B, the substrate 11 has a shape that is long in one direction (X direction), and is short in a direction (Y direction) that is orthogonal or substantially orthogonal to the X direction and to a thickness direction (Z direction). The substrate 11 includes a main surface 111 and a main surface 112 that are parallel or substantially parallel with the X and Y directions and are opposite to each other. The substrate 11 includes an end surface 10E1 at one end portion in the X direction. The substrate 11 further includes an end surface 10E2 at the other end portion opposite to the end surface 10E1 (see FIG. 3). The substrate 11 includes an end surface 10E3 at one end portion in the Y direction and an end surface 10E4 at the other end portion in the Y direction.

The substrate 11 includes a plurality of resin layers, each of which mainly includes an insulating material. The plurality of resin layers have flexibility. As the insulating material, for example, a liquid crystal polymer may preferably be used. A predetermined electrode pattern including a signal electrode S11, a signal electrode S12, a ground electrode, and the like as illustrated in FIGS. 1 and 2B is provided on the plurality of resin layers. The plurality of resin layers are stacked and pressure bonded with heat. The substrate 11 is flexible because the plurality of resin layers are flexible and the electrode pattern is thin.

A plurality of mounting electrodes 13 are provided on the main surface 111 of the substrate 11. As illustrated in FIGS. 1 and 2B, the plurality of mounting electrodes 13 are connected to the signal electrode S11 provided inside the substrate 11 and the signal electrode S12, respectively using an interlayer connection electrode V11 and an interlayer connection electrode V12.

The plurality of mounting electrodes 13 have a rectangular or substantially rectangular shape in plan view. The plurality of mounting electrodes 13 are disposed in a predetermined pattern in plan view. For example, as illustrated in FIG. 2A, the plurality of mounting electrodes 13 are arranged in a two-dimensional array having two orthogonal or substantially orthogonal axes in the X and Y directions, while being separated from each other by a predetermined distance. A frame-shaped region (region defined by the dotted line in FIG. 2 (A)) connecting between the outer edges of cavities (cavities provided in a protective layer 12 described later) in the plurality of mounting electrodes 13 defines and functions as a mounting region Re13. The mounting region Re13 is separated from the end surface 10E1 and from the end surfaces 10E3 and 10E4.

The protective layer 12 is provided on the main surface 111 of the substrate 11. The protective layer 12 has heat resistance, durability, and insulating properties, and has a predetermined thickness. A front surface 113 of the protective layer 12 that is on the opposite side of the surface that comes into contact with the main surface 111 of the substrate 11 corresponds to a "first main surface". Similarly, in the substrate 21, a front surface 213 of the protective layer 22 that is on the opposite side of the surface that comes into contact with the main surface 211 of the circuit member 20 corresponds to a "second main surface".

The protective layer 12 includes a plurality of cavities. The cavity of the protective layer 12 is an area where the protective layer 12 is partially absent. A portion of the plurality of cavities is configured so that center portions of the plurality of mounting electrodes 13 are exposed to the outside while end portions of the plurality of mounting electrodes 13 are covered.

Further, cavities, of the plurality of cavities, not overlapping with the plurality of mounting electrodes 13 are configured so as to expose the main surface 111 of the substrate 11 to the outside. With these cavities exposing the main surface 111 to the outside, the circuit member 10 includes recesses 121 and 122 recessed from the front surface 113 of the protective layer 12. These recesses 121 and 122 correspond to a "first recess". In this configuration, the distance between the end surface 10E1 and the recess 121 is shorter than the distance between the end surface 10E2 and the recess 122, in the extending direction of the circuit member 10. Similarly, recesses 221 and 222 of the substrate 21 correspond to a "second recess".

The recess 121 is provided between the mounting region Re13 and the end surface 10E1. The recess 121 does not overlap with the plurality of mounting electrodes 13. The recess 121 is rectangular or substantially rectangular in plan view, includes a wall surface 121E1 and a wall surface 121E2 parallel or substantially parallel to the end surface 10E1, and includes a wall surface 121E3 and a wall surface 121E4 parallel or substantially parallel to the end surface 10E3 and the end surface 10E4. The wall surface 121E1 is a wall surface of the recess 121 on the side of the end surface 10E1, and the wall surface 121E2 is a wall surface of the recess 121 on the side of the plurality of mounting electrodes 13. The wall surface 121E3 is a wall surface of the recess 121 on the side of the end surface 10E3, and the wall surface 121E4 is a wall surface of the recess 121 on the side of the end surface 10E4.

A distance L1 between the recess 121 and the mounting region Re13 is longer than the shortest one of intervals among the plurality of mounting electrodes 13. More specifically, the distance L1 is a distance between the recess 121 side end surface of the cavity of the plurality of mounting electrodes 13 that is closest to the recess 121, and the wall surface 121E2 of the recess 121.

Furthermore, in the Y direction, the wall surface 121E3 of the recess 121 is closer to the end surface 10E3 than the end surface 10E3 side end portion of the mounting region Re13 is. Similarly, in the Y direction, the wall surface 121E4 of the recess 121 is closer to the end surface 10E4 than the end surface 10E4 side end portion of the mounting region Re13 is.

The area of the recess 121 is larger than the area of the cavity of the mounting electrode 13. A depth D121 of the recess 121 is larger than a depth D13 of the cavity on the front surface side of the mounting electrode 13.

The recess 122 is provided on the side opposite to the end surface 10E1, relative to the mounting region Re13. The recess 122 does not overlap with the plurality of mounting electrodes 13.

The recess 122 is rectangular or substantially rectangular in plan view, includes a wall surface 122E1 and a wall surface 122E2 parallel or substantially parallel to the end surface 10E1, and includes a wall surface 122E3 and a wall surface 122E4 parallel or substantially parallel to the end surface 10E3 and the end surface 10E4. The wall surface 122E1 is a wall surface of the recess 122 on the side of the end surface 10E1 (the side of the plurality of mounting electrodes 13), and the wall surface 122E2 is a wall surface of the recess 122 facing the wall surface 122E1. The wall surface 122E3 is a wall surface of the recess 122 on the side of the end surface 10E3, and the wall surface 122E4 is a wall surface of the recess 122 on the side of the end surface 10E4.

A distance L2 between the recess 122 and the mounting region Re13 is longer than the shortest distance between the plurality of mounting electrodes 13. More specifically, the distance L2 is a distance between the recess 122 side end surface of the cavity of the plurality of mounting electrodes 13 that is closest to the recess 122, and the wall surface 122E1 of the recess 122.

Furthermore, in the Y direction, the wall surface 122E3 of the recess 122 is closer to the end surface 10E3 than the end surface 10E3 side end portion of the mounting region Re13 is. Similarly, in the Y direction, the wall surface 122E4 of the recess 122 is closer to the end surface 10E4 than the end surface 10E4 side end portion of the mounting region Re13 is.

The area of the recess 122 is larger than the area of the cavity of the mounting electrode 13. A depth D122 of the recess 122 is larger than a depth D13 of the cavity on the front surface side of the mounting electrode 13.

The circuit member 20 includes a substrate 21, a protective layer 22, a plurality of mounting electrodes 23, and recesses 221 and 222. The substrate 21 has the same or substantially the same configuration as the substrate 11 of the circuit member 10. The substrate 21 includes an end surface 20E1 at one end portion in the X direction. The substrate 21 further includes an end surface 20E2 at the other end portion opposite to the end surface 20E1 (see FIG. 3). Further, the substrate 21 includes a main surface 211 corresponding to the main surface 111 of the substrate 11, and includes a main surface 212 corresponding to the main surface 112. Further, the substrate 21 includes a front surface 213 corresponding to the front surface 113 of the substrate 11.

The protective layer 22 has the same or substantially the same configuration as the protective layer 12 of the circuit member 10. The plurality of mounting electrodes 23 have the same or substantially the same configuration as the plurality of mounting electrodes 13 of the circuit member 10. The recess 221 has the same or substantially the same configuration as the recess 121 of the circuit member 10, and the recess 222 has the same or substantially the same configuration as the recess 122 of the circuit member 10. In this configuration, the distance between the end surface 20E1 and the recess 221 in the extending direction of the circuit member 20 is shorter than the distance between the end surface 20E2 and the recess 222.

Joint Structure

As illustrated in FIG. 1, the circuit member 10 and the circuit member 20 are arranged such that the front surface 113 of the protective layer 12 (corresponding to a portion of the main surface of the circuit member 10) and the front surface 213 of the protective layer 22 (corresponding to a portion of the main surface of the circuit member 20) face each other. More specifically, the circuit member 10 and the circuit member 20 are arranged so as to have the following relationship. As illustrated in FIG. 1, the circuit member 10 and the circuit member 20 partially overlap each other in the extending direction (longitudinal direction). Specifically, in the extending direction of the circuit member 10 (X direction in FIG. 1), the circuit member 10 and the circuit member 20 are partially overlapped with each other such that the end surface 20E1 of the circuit member 20 is arranged between the end surface 10E1 and the end surface 10E2 of the circuit member 10. The front surface 113 of the protective layer 12 and the front surface 213 of the protective layer 22 are at least partially in contact with each other, or the front surface 113 and the front surface 213 are arranged a close distance from each other. This close distance is sufficiently smaller than the thickness of the circuit member 10 and the circuit member 20.

The plurality of mounting electrodes 13 of the circuit member 10 and the plurality of mounting electrodes 23 of the circuit member 20 face each other one-to-one. The recess 121 of the circuit member 10 and the recess 222 of the circuit member 20 face each other. The recess 122 of the circuit member 10 and the recess 221 of the circuit member 20 face each other.

The conductive joining material 30 and the insulating joining material 40 are sandwiched between the circuit member 10 and the circuit member 20.

More specifically, the conductive joining material 30 is arranged between the mounting electrode 13 and the mounting electrode 23, and is in contact with and joined to both the mounting electrode 13 and the mounting electrode 23. In other words, the conductive joining material 30 fills the cavity on the front surface side of the mounting electrode 13 and the cavity on the front surface side of the mounting electrode 23. Solder, for example, is typically used for the conductive joining material 30.

The insulating joining material 40 is disposed in a space surrounded by the recess 121 and the recess 222, and in a space surrounded by the recess 122 and the recess 221. The insulating joining material 40 comes into contact with and is joined to an entirety or substantially an entirety of the bottom of the recess 121 (a portion of the main surface 111 of the substrate 11) and the bottom of the recess 222 (a portion of the main surface 211 of the circuit member 20). Similarly, the insulating joining material 40 comes into contact with and is joined to an entirety or substantially an entirety of the bottom of the recess 122 (a portion of the main surface 111 of the substrate 11) and the bottom of the recess 221 (a portion of the main surface 211 of the circuit member 20).

More specifically, the insulating joining material 40 joins an end portion of the circuit member 10 and an end portion of the circuit member 20. An example is described where the main surface 111 of the circuit member 10 and the main surface 211 of the circuit member 20 are joined in the end portion illustrated in FIG. 1. However, the present invention is not limited to this, and as will be described later, the main surface 111 (main surface 211) of the circuit member 10 (circuit member 20) and the main surface 213 (main surface 113) of the circuit member 20 (circuit member 10) may be in contact with each other. Furthermore, the main surface 113 of the circuit member 10 and the main surface 213 of the circuit member 20 may be in contact with each other.

Furthermore, the insulating joining material 40 spreads beyond the space surrounded by the recess 121 and the recess 222 by a predetermined amount, and this spreading portion is in contact with and joined with the front surface 113 of the protective layer 12 and the front surface 213 of the protective layer 22. The insulating joining material 40 spreads beyond the space surrounded by the recess 122 and the recess 221 by a predetermined amount, and this spreading portion is in contact with and joined with the front surface 113 of the protective layer 12 and the front surface 213 of the protective layer 22. The insulating joining material 40 is preferably not in contact with the conductive joining material 30.

The insulating joining material 40 is preferably made of, for example, a resin material having an insulating property. For example, an epoxy resin is preferably used as a main material, and a filler or the like is kneaded as appropriate. The insulating joining material 40 is preferably, for example, a thermosetting material, and preferably has a higher viscosity than the conductive joining material 30 in a heated state (for example, at a temperature at which the conductive joining material 30 melts).

The shapes of the recess 121, the recess 122, the recess 221 and the recess 222 are not limited to rectangular in plan view. For example, the shape may be substantially rectangular, elliptical, oval, or the like, and it is also possible to configure the wall surface on the side far from the mounting region Re13 with a curved surface with a bulging center portion.

In the first preferred embodiment, the recess 121, the recess 122, the recess 221, and the recess 222 are provided by using the protective layer 12. Alternatively, instead of the protective layer 12, a cover layer that is provided on the main surface 111 of the substrate 11 and is made of the same or substantially the same material as the substrate 11 and integrally provided with the substrate 11 may be used to provide the recess 121, the recess 122, the recess 221, and the recess 222.

Configuration of Member Adopting Joint Structure

Figure 3:
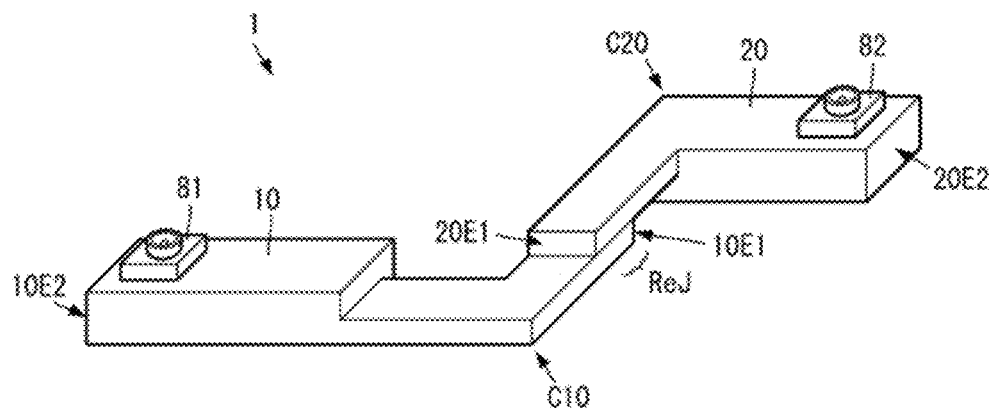
FIG. 3 is a perspective view illustrating an example of a signal transmission member including a joint structure of the circuit members 10 and 20 according to a preferred embodiment of the present invention.
Figure 4:
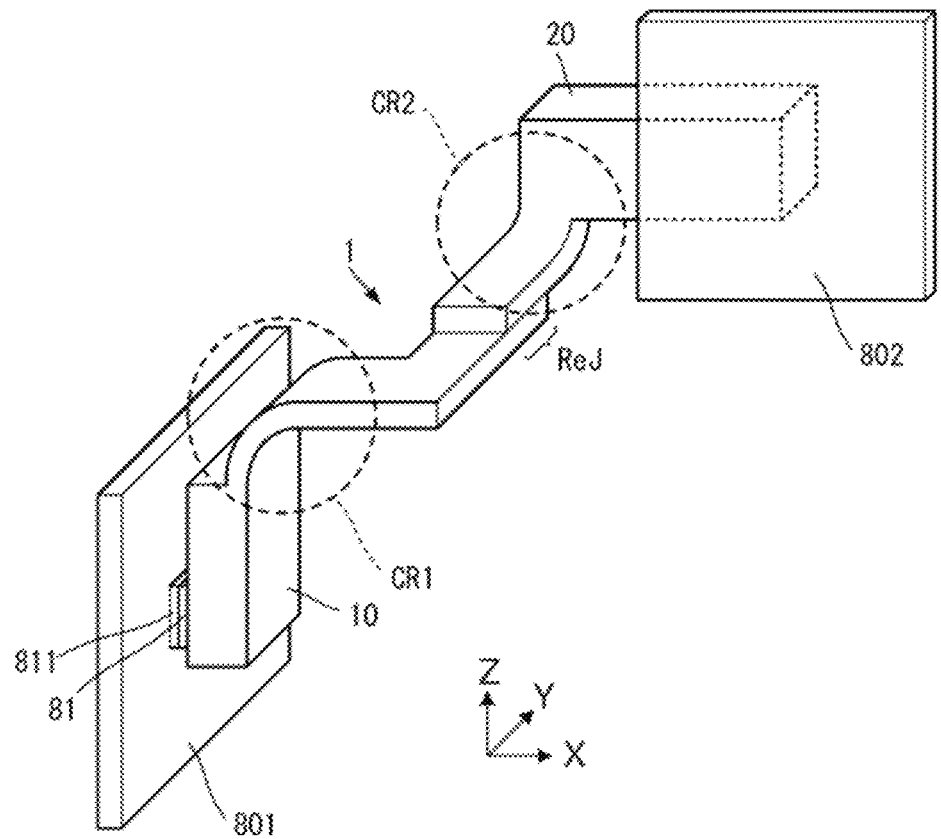
FIG. 4 is a perspective view illustrating one aspect of the arrangement of a signal transmission member 1.

With the joint structure of the circuit member 10 and the circuit member 20 having the above-described configuration, for example, the following signal transmission member can be provided. FIG. 3 is a perspective view illustrating an example of a signal transmission member using the circuit member joint structure according to a preferred embodiment of the present invention. FIG. 4 is a perspective view illustrating one aspect of the arrangement of the signal transmission member.

As illustrated in FIG. 3, a signal transmission member 1 includes the circuit member 10 and the circuit member 20. The circuit member 10 and the circuit member 20 are joined at an end portion of the circuit member 10 and an end portion of the circuit member 20, and each include a joint portion ReJ. The joint portion ReJ of the circuit member 10 is in the vicinity of the end surface 10E1. The joint portion ReJ of the circuit member 20 is in the vicinity of the end surface 20E1. The above-described joint structure is used as the structure of the joint portion ReJ.

A connector 81 for external connection is mounted in the vicinity of the end surface 10E2 of the circuit member 10 on the opposite side of the end surface 10E1. The connector 81 is connected to the signal electrode S11 and the signal electrode S12 described above.

A connector 82 for external connection is mounted in the vicinity of the end surface 20E2 of the circuit member 20 on the opposite side of the end surface 20E1. The connector 82 is connected to the signal electrode S21 and the signal electrode S22 described above.

A bent portion C10 is provided at an intermediate location in the extending direction of the circuit member 10. A bent portion C20 is provided at an intermediate location in the extending direction of the circuit member 20. The bent portion C10 and the bent portion C20 have a bent shape without receiving external force.

Such a shape is complicated and thus an attempt to form the signal transmission member 1 as a single piece member would result in a limited number of such members obtainable from a mother sheet at the time of manufacturing.

On the other hand, by dividing the signal transmission member 1 into the circuit member 10 and the circuit member 20 each having a simpler shape, the number of signal transmission members 1 obtainable from the mother sheet at the time of manufacturing can be increased.

With the joint portion ReJ between the circuit member 10 and the circuit member 20 having the structure described in the above-described preferred embodiment, high reliability of the electrical and physical connection between the circuit member 10 and the circuit member 20 can be achieved. More specifically, with the insulating joining material 40 in the joint portion ReJ provided at a position closer to the bent portions C10 and C20 than the conductive joining material 30 is, transmission of stress to the joint surface of the conductive joining material 30 is reduced or prevented. Thus, the joining reliability equivalent or substantially equivalent to that achieved with the structure in which the signal transmission member 1 is formed as a single piece member can be ensured.

Instead of simply transmitting signals, the signal transmission member 1 may also include, for example, a filter or the like provided at an intermediate portion.

Then, such a signal transmission member 1 may be used as illustrated in FIG. 4. As illustrated in FIG. 4, the connector 81 of the signal transmission member 1 is attached to a connector 811 mounted on the main surface of the circuit board 801. The connector 82 (not illustrated) of the signal transmission member 1 is attached to a connector (not illustrated) mounted on the main surface of the circuit board 802.

The main surface of the circuit board 801 and the main surface of the circuit board 802 are orthogonal or substantially orthogonal to each other. Therefore, to mount the connector 81, the signal transmission member 1 includes a curved portion CR1 provided at an intermediate location in the extending direction of the circuit member 10. Furthermore, to mount a connector (not illustrated), a curved portion CR2 is provided at an intermediate location in the extending direction of the circuit member 20. The curved portion CR1 and the curved portion CR2 are portions that are curved by external force.

In this case, stress is applied to the circuit member 10 and the circuit member 20 due to the curve. This stress results in the joint portion ReJ receiving a stress in a direction in which the circuit member 10 and the circuit member 20 are peeled from one another. Thus, the stress acts to break the joint surface between the conductive joining material 30 and the mounting electrodes 13 and 23, or to break the conductive joining material 30 itself. However, the insulating joining material 40 used as described above can prevent such breaking. Therefore, a highly reliable signal transmission member 1 can be provided.

The Young's modulus of the insulating joining material 40 may be higher than the Young's modulus of the circuit member 10 and the circuit member 20. With such a configuration, the above-described stress can be further reduced or prevented. That is, the stress from the outside is reduced or prevented by the insulating joining material 40, such that the transmission of the stress to the joint surface between the conductive joining material 30 and the mounting electrode 13 and the mounting electrode 23 is reduced or prevented.

Joining Method

Next, a joining method for achieving the above-described joint configuration will be described with reference to the drawings.

First Joining Method

Figure 5:
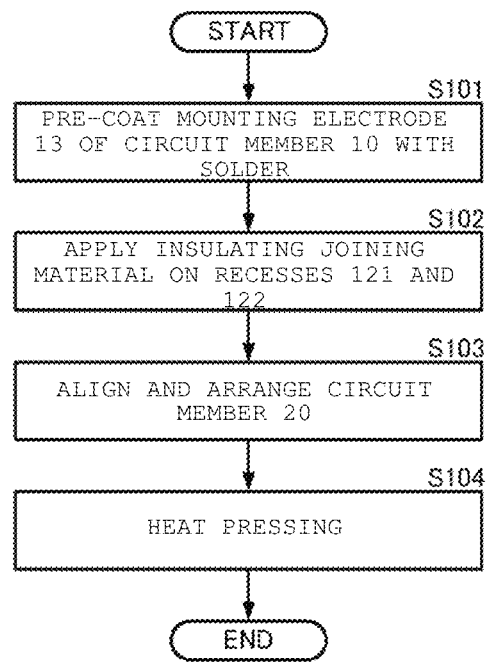
FIG. 5 is a flowchart illustrating a first joining method of circuit members 10 and 20 according to a preferred embodiment of the present invention.
Figure 6A:
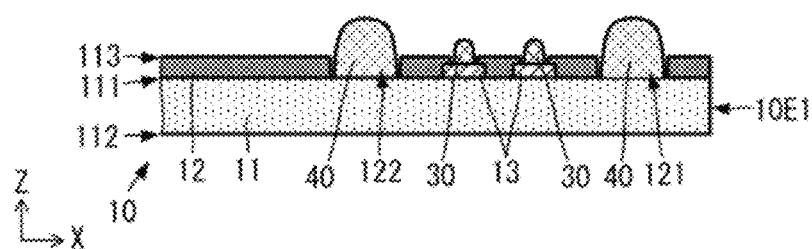
FIGS. 6A to 6C are diagrams each illustrating a state in a certain step in the first joining method.
Figure 6B:
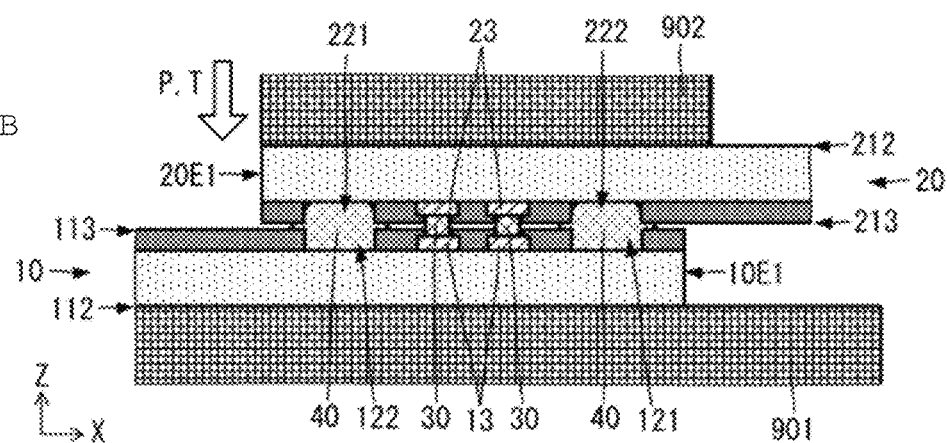
Figure 6C:
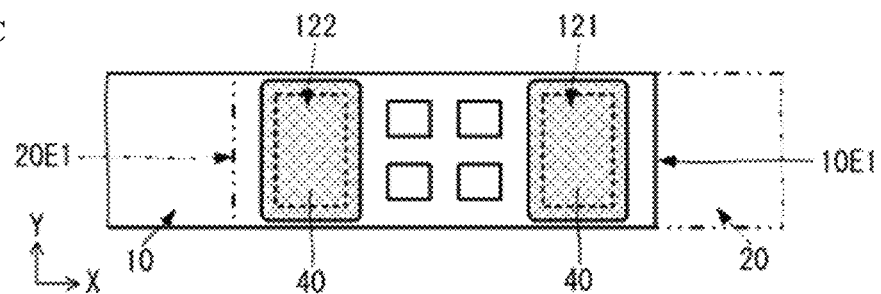

FIG. 5 is a flowchart illustrating a non-limiting example of a first joining method of circuit members according to the present preferred embodiment of the present invention. FIGS. 6A to 6C are diagrams each illustrating a state in a certain step in the first joining method.

First, the circuit member 10 is prepared, and the cavity on the mounting electrode 13 is pre-coated with solder which is the conductive joining material 30 (S101). In this process, the pre-coating solder is provided up to a height high enough to protrude outward from the main surface of the circuit member 10 (here, the front surface 113 of the protective layer 12).

Next, the insulating joining material 40 is applied to the recesses 121 and 122 of the circuit member 10 (S102). In this process, the insulating joining material 40 is applied up to a height high enough to be projected from the main surface of the circuit member 10. The amount of the insulating joining material 40 applied is larger than the combined volume of the spaces provided by the recess 121 and the recess 222 and the combined volume of the spaces provided by the recess 122 and the recess 221. Preferably, the amount of the insulating joining material 40 applied is as small as possible while being larger than the combined volume of the spaces provided by the recess 121 and the recess 222 and the combined volume of the spaces provided by the recess 122 and the recess 221. With this configuration, as illustrated in FIG. 6A, a state where the conductive joining material 30 and the insulating joining material 40 are arranged on the circuit member 10 is achieved.

Next, the circuit member 20 is arranged while being aligned with the circuit member 10 (S103). In this process, as illustrated in FIG. 6B, the circuit member 20 is arranged relative to the circuit member 10, with the mounting electrode 13 facing the mounting electrode 23, the recess 121 facing the recess 222, and the recess 122 facing the recess 221.

Next, heat pressing (heating, pressing) is performed in a state where the circuit member 10 and the circuit member 20 are aligned (S104). More specifically, as illustrated in FIG. 6B, a base substrate 901 for the heat pressing is brought into contact with the main surface 112 of the circuit member 10. Furthermore, a heat pressing member 902 is brought into contact with the main surface 212 of the circuit member 20. Then, at least one of the base substrate 901 and the heat pressing member 902 is heated, and the heat pressing member 902 is pushed toward the base substrate 901. For example, solder with a melting point of about 130° C. to about 210° C. can be used as the conductive joining material 30, and an epoxy resin with a curing temperature of about 150° C. to about 200° C. can be used as the insulating joining material 40. The temperature of the heat pressing may preferably be higher than one of the melting point of the conductive joining material 30 and the curing temperature of the insulating joining material 40, by about 20° C. to about 60° C., for example.

With this configuration, the main surface of the circuit member 10 (here, the front surface 113 of the protective layer 12) and the main surface of the circuit member 20 (here, the front surface 213 of the protective layer 22) are disposed so as to be close to each other or in contact with each other The insulating joining material 40 spreads by the pressing.

The insulating joining material 40 is cured by the heating. As a result, the circuit member 10 and the circuit member 20 are physically joined to each other. FIG. 6B illustrates an example in which the end portion of the circuit member 10 and the end portion of the circuit member 20 are joined to each other. In this process, as described above, the amount of the insulating joining material 40 applied is larger than the volume of the spaces provided by the recess 122 and the recess 221 and the volume of the spaces provided by the recess 121 and the recess 222. As a result, as illustrated in FIG. 6C, the insulating joining material 40 not only covers regions between the recesses 122 and 221 and between the recesses 121 and 222, but also spreads to a region between the front surface 113 of the protective layer 12 and the front surface 213 of the protective layer 22. Thus, a large joint area is obtained, such that higher joint strength is achieved.

Furthermore, by the heating, the conductive joining material 30 is melted and comes into close contact with the mounting electrode 13 and the mounting electrode 23. Then, when the heat pressing is stopped, the conductive joining material 30 is cured, and the mounting electrode 13 and the mounting electrode 23 are physically and electrically joined to each other.

In such a manufacturing method, the insulating joining material 40 spreads as described above. As described above, with the recess 121, the recess 122, the recess 221, and the recess 222 provided, the spreading size of the insulating joining material 40 can be controlled. Therefore, the insulating joining material 40 can be prevented from inhibiting the joining by the conductive joining material 30. In particular, as illustrated in FIG. 1, with the insulating joining material 40 not being in contact with the conductive joining material 30, the interface between the insulating joining material 40 and the conductive joining material 30 can be prevented from breaking due to external stress.

The heat pressing may be performed with the pressing and the heating concurrently occurring, with the pressing and the heating performed in this order, or with the heating and the pressing performed in this order.

Furthermore, when this manufacturing method is used, even if the insulating joining material 40 spreads out from the recess 121, the recess 122, the recess 221, and the recess 222, the insulating joining material 40 is prevented from coming into contact with the conductive joining material 30. Thus, a highly reliable joint structure can be obtained that is free of breakage at the interface between the insulating joining material 40 and the conductive joining material 30. Furthermore, the joint strength can be improved with the insulating joining material 40 spreading out from the recess 121, the recess 122, the recess 221, and the recess 222.

Second Joining Method

Figure 7:
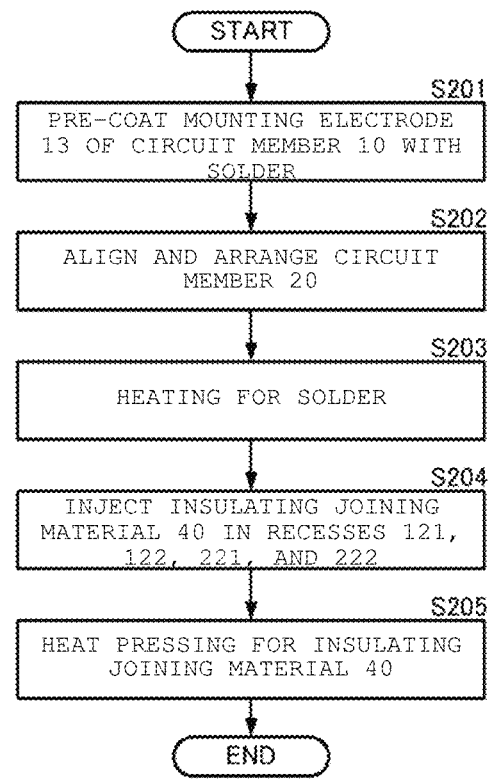
FIG. 7 is a flowchart illustrating a second joining method of circuit members 10 and 20 according to a preferred embodiment of the present invention.

FIG. 7 is a flowchart illustrating a non-limiting example of a second joining method of circuit members according to the present preferred embodiment of the present invention. FIGS. 8A to 8E are diagrams each illustrating a state in a certain step in the second joining method.

Figure 8A:
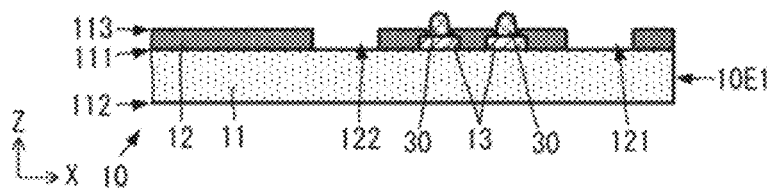
FIGS. 8A to 8E are diagrams each illustrating a state in a certain step in the second joining method.

First, the circuit member 10 is prepared, and the cavity on the mounting electrode 13 is pre-coated with solder which is the conductive joining material 30 as illustrated in FIG. 8A (S201) In this process, the pre-coating solder is provided up to a height high enough to protrude outward from the main surface of the circuit member 10 (here, the front surface 113 of the protective layer 12).

Figure 8B:
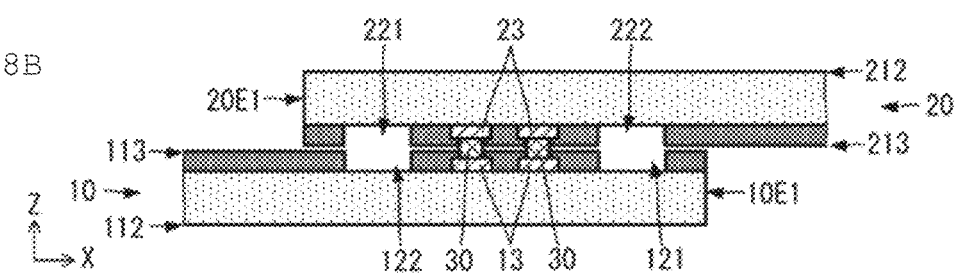

Next, the circuit member 20 is arranged while being aligned with the circuit member 10 (S202). In this process, as illustrated in FIG. 8B, the circuit member 20 is arranged relative to the circuit member 10, with the mounting electrode 13 facing the mounting electrode 23, the recess 121 facing the recess 222, and the recess 122 facing the recess 221.

Next, heating is performed for the conductive joining material 30 in a state where the circuit member 10 and the circuit member 20 are aligned (S203). The heating for the conductive joining material 30 is performed, for example, using a reflow, an oven, or a hot bar. Thus, the mounting electrode 13 and the mounting electrode 23 are physically and electrically joined to each other via the conductive joining material 30. When solder with a melting point of about 130° C. to about 210° C. is used as the conductive joining material 30, the maximum temperature of the heating may be about 240° C., for example.

Figure 8C:
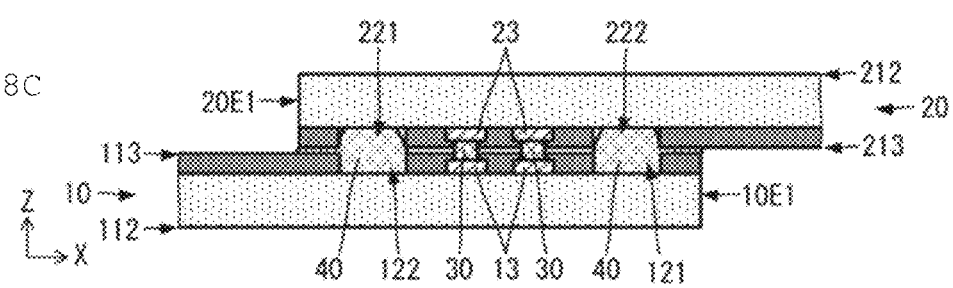

Next, as illustrated in FIG. 8C, the insulating joining material 40 is injected between the gap between the circuit member 10 and the circuit member 20, between the recess 121 and the recess 222, and between the recess 122 and the recess 221, from the end surface 20E1 side and from the end surface 10E1 side (S204).

Figure 8D:
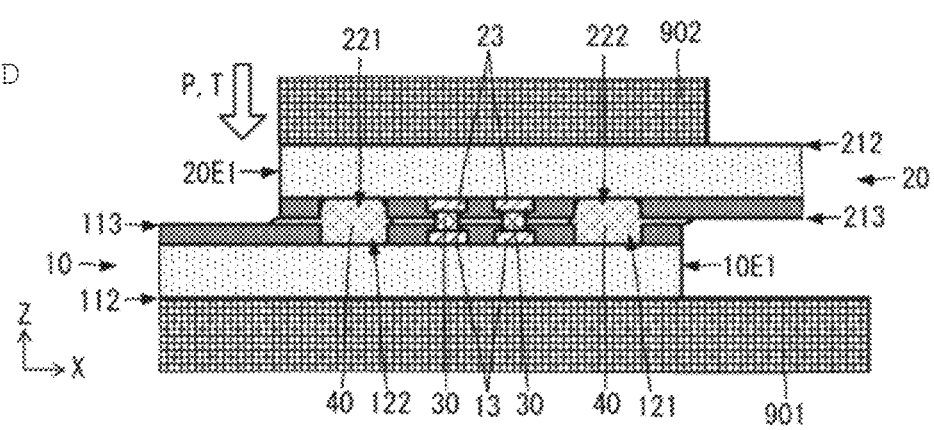

Next, heat pressing (heating and pressing) is performed for the insulating joining material 40 (S205). More specifically, as illustrated in FIG. 8D, the base substrate 901 for the heat pressing is brought into contact with the main surface 112 of the circuit member 10. Furthermore, a heat pressing member 902 is brought into contact with the main surface 212 of the circuit member 20. In this state, at least one of the base substrate 901 and the heat pressing member 902 is heated, and the heat pressing member 902 is pushed toward the base substrate 901. The heating temperature for the insulating joining material 40 may be about 140° C., and the duration of the heating may be about 15 minutes, for example.

With this configuration, the main surface of the circuit member 10 (here, the front surface 113 of the protective layer 12) and the main surface of the circuit member 20 (here, the front surface 213 of the protective layer 22) are close to each other or in contact with each other The insulating joining material 40 is cured by the heating. As a result, the circuit member 10 and the circuit member 20 are physically joined to each other.

Figure 8E:
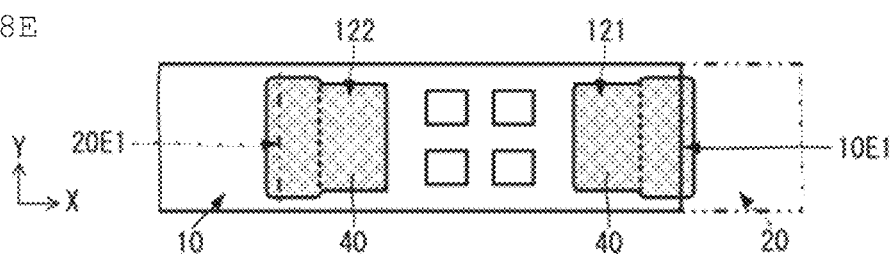

In this process, as described above, the insulating joining material 40 is injected into the recesses 121, 122, 221, and 222 from the end surfaces 10E1 and 20E1, with the amount exceeding the volume of the spaces provided by the recess 122 and the recess 221 and the volume of the spaces provided by the recess 121 and the recess 222. As a result, as illustrated in FIG. 8E, the insulating joining material 40 not only covers regions between the recesses 122 and 221 and between the recesses 121 and 222, but also spreads to a region between the front surface 113 of the protective layer 12 and the front surface 213 of the protective layer 22. In particular, the spreading area increases toward the end surface 10E1 and the end surface 20E1. Thus, a large joint area is obtained, such that higher joint strength is achieved.

With the above configuration, the joint structure of the circuit member 10 and the circuit member 20 provides various advantageous effects described below.

The circuit member 10 is provided with the recess 121 and the recess 122, the circuit member 20 is provided with the recess 221 and the recess 222, and the insulating joining material 40 is provided to fill the recess 121, the recess 122, the recess 221, and the recess 222. Thus, a large amount of the insulating joining material 40 can be used, without the insulating joining material 40 entering the interface between the conductive joining material 30 and the mounting electrode 23. Thus, while maintaining high strength and reliability of the physical joining between the circuit member 10 and the circuit member 20 by the insulating joining material 40, the electrical and physical joining between the mounting electrode 13 and the mounting electrode 23 can be reliably achieved by the conductive joining material 30.

In particular, in the above example, the insulating joining material 40 is not in contact with the conductive joining material 30. Thus, a gap is provided between the insulating joining material 40 and the conductive joining material 30 to absorb stress. Thus, the interface between the insulating joining material 40 and the conductive joining material 30 can be prevented from breaking due to the external stress, while ensuring the electrical and physical joining described above. In particular, with a curved portion formed by external force as illustrated in FIG. 4 described above, a relatively large breaking stress is applied to the joint portion. However, with the insulating joining material 40 not being in contact with the conductive joining material 30, the interface between the insulating joining material 40 and the conductive joining material 30 can be prevented from breaking due to stress attributable to the twisting. Therefore, the joint portion between the mounting electrode 13 and the mounting electrode 23 obtained using the conductive joining material 30 can be prevented from breaking, and further improvement of reliability is achieved.

As described above, the depth D121 of the recess 121 and the depth D122 of the recess 122 are equal to or greater than the depth D13 of the cavity on the front surface side of the mounting electrode 13. Furthermore, the area of the recess 121 and the recess 122 is larger than the area of the largest one of the cavities of the plurality of mounting electrodes 13.

Furthermore, the distance between one of the cavities of the plurality of mounting electrodes 13 closest to the recess 121 and the recess 121 is longer than the shortest one of the intervals between the cavities of the plurality of mounting electrodes 13. Furthermore, the distance between one of the cavities of the plurality of mounting electrodes 13 closest to the recess 122 and the recess 122 is longer than the shortest one of the intervals between the cavities of the plurality of mounting electrodes 13. With these configurations, the insulating joining material 40 can be prevented from flowing to the front surface of the mounting electrode 13.

Similarly, the depth of the recess 221 and the depth of the recess 222 are equal to or greater than the depth of the cavity on the front surface side of the mounting electrode 23. Furthermore, the area of the recess 221 and the recess 222 is larger than the area of the largest one of the cavities of the plurality of mounting electrodes 23. Furthermore, the distance between one of the cavities of the plurality of mounting electrodes 23 closest to the recess 221 and the recess 221 is longer than the longest one of the intervals among the cavities of the plurality of mounting electrodes 23. Furthermore, the distance between one of the cavities of the plurality of mounting electrodes 23 closest to the recess 222 and the recess 222 is longer than the longest one of the intervals between the cavities of the plurality of mounting electrodes 23.

With such a configuration, the insulating joining material 40 can be prevented from flowing to the front surface of the mounting electrode 23.

Furthermore, with the recess 121 and the recess 222 facing each other, the insulating joining material 40 disposed between the recess 121 and the recess 222 can be thick. Thus, the joint strength between the circuit member 10 and the circuit member 20 can be improved. Similarly, with the recess 122 and the recess 221 facing each other, the insulating joining material 40 disposed between the recess 122 and the recess 221 can be thick. Thus, the joint strength between the circuit member 10 and the circuit member 20 can be improved. The recess 121 and the recess 222 preferably face each other over their entirety or substantially their entirety, but it is sufficient if they at least partially face each other. Similarly, the recess 122 and the recess 222 preferably face each other over their entirety or substantially their entirety, but it is sufficient if they at least partially face each other.

Furthermore, as illustrated in FIGS. 1, 2A, and 2B, the recess 121 and the recess 122 sandwich the mounting electrode 13 in the X direction, that is, in plan view. Similarly, the recess 221 and the recess 222 sandwich the mounting electrode 23. As a result, the joint portion between the circuit member 10 and the circuit member 20 obtained using the conductive joining material 30 is sandwiched between the joint portions between the circuit member 10 and the circuit member 20 obtained using the insulating joining material 40. Therefore, even if a stress that pulls the end portion of the circuit member 10 opposite to the end surface 10E1 and the end portion of the circuit member 20 opposite to the end surface 20E1 in the opposite directions in the thickness direction (Z direction) is applied, direct application of the stress to the conductive joining material 30 can be reduced or prevented by the insulating joining material 40. Therefore, the conductive joining material 30 can prevent the joint portion between the circuit member 10 and the circuit member 20 from breaking, such that the reliability is improved.

The insulating joining material 40 is preferably, for example, thermosetting material with a higher viscosity than the conductive joining material 30. As a result, it is possible to prevent the insulating joining material 40 from flowing to the front surfaces of the mounting electrode 13 and the mounting electrode 23 during the heat pressing.

The coefficient of linear expansion of the insulating joining material 40 and the coefficient of linear expansion of the conductive joining material 30 are the same or substantially the same. As a result, the joint portion using the conductive joining material 30 can be prevented from breaking due to warpage and the like of the substrate 11 and the substrate 21 caused by a difference in the coefficient of linear expansion, when the heat pressing is performed. In this case, as described above, for example, when solder is used as the conductive joining material 30 and the insulating joining material 40 includes epoxy resin as the main material, the coefficient of linear expansion can be set to be the same or substantially the same between the insulating joining material 40 and the conductive joining material 30, using readily available materials.

Furthermore, the circuit member 10 and the circuit member 20 have flexibility. In this case, the circuit member 10 and the circuit member 20 may be physically bent to be used as described later. Still, with the above-described configuration, direct application of the stress to the joint portion obtained by the conductive joining material 30, due to bending can be reduced or prevented. Thus, a highly reliable circuit member joint configuration can be provided.

Furthermore, with the melting point of the conductive joining material 30 being higher than the curing temperature of the insulating joining material, unwanted spreading out of the conductive joining material 30 can be reduced or prevented.

Furthermore, portions of the circuit member 10 and the circuit member 20 outside the joint portion do not face each other in plan view. In such a case, the effect of making the mounting electrode 13 and the mounting electrode 23 face each other by self-alignment is less likely to occur. Still, with the above configuration, the insulating joining material 40 causes the mounting electrode 13 and the mounting electrode 23 to face each other, such that joining by the conductive joining material 30 can be easily achieved.

Furthermore, the wall surface 121E3 of the recess 121 is closer to the end surface 10E3 than the end surface 10E3 side end portion of the mounting region Re13 is. Similarly, in the Y direction, the wall surface 121E4 of the recess 121 is closer to the end surface 10E4 than the end surface 10E4 side end portion of the mounting region Re13 is. The recess 122, the recess 221, and the recess 222 also have the same or similar structure. With such a configuration, even if stress is applied in a direction of peeling the circuit member 10 and the circuit member 20 from each other as illustrated in FIG. 4, the mounting region is protected over the entirety or substantially the entirety in the width direction (Y direction in FIG. 2), such that the stress applied to the mounting electrode 13 and the mounting electrode 23 can be further reduced or prevented.

By using the above-described first joining method, the joint structure can be provided through simple processes. Further, by using the above-described second joining method, an increase in the joint area of the insulating joining material 40 is facilitated, and a structure to improve the joint strength can be easily provided.

In the configuration described above, recesses are provided in both the circuit member 10 and the circuit member 20. Alternatively, the recess may be provided in at least one of the circuit member 10 and the circuit member 20, and may not be provided in the other one. Still, a risk of the insulating joining material 40 coming into contact with the conductive joining material 30 can be more effectively reduced or prevented by providing the recesses in both the circuit member 10 and the circuit member 20. Furthermore, with the recesses provided in both the circuit member 10 and the circuit member 20, the joint area and the joint strength can be increased.

Furthermore, in the above description, the circuit member 10 includes the recess 121 and the recess 122 that sandwich the mounting region Re13 in which the mounting electrode 13 is disposed. It should be noted that, the joint strength can be increased with any one of the recesses 121 and 122 provided. The same applies to the circuit member 20. Still, it is more advantageous to provide both the recess 121 and the recess 122, and both the recess 221 and the recess 222 because with such a configuration, stress from both sides in the X direction can be reduced or prevented.

Second Preferred Embodiment

Figure 9:
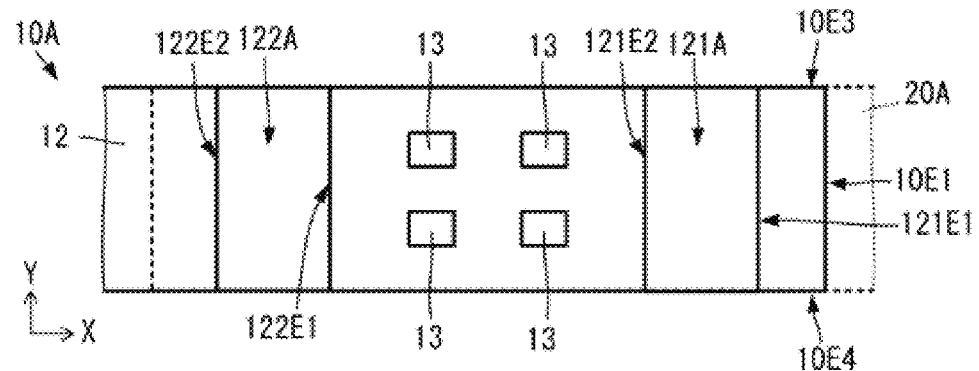
FIG. 9 is a plan view illustrating a configuration of a joint portion of a circuit member 10A.

Next, a circuit member joint structure according to a second preferred embodiment of the present invention will be described with reference to the drawings. FIG. 9 is a plan view illustrating a configuration of a joint portion of circuit members.

As illustrated in FIG. 9, a circuit member 10A in the circuit member joint structure according to the second preferred embodiment is different from the circuit member 10 according to the first preferred embodiment in that a recess 121A and a recess 122A are provided. Other configurations of the circuit member 10A are the same or substantially the same as those of the circuit member 10, and the description of the same or similar portions will be omitted. Although not shown in FIG. 9, a circuit member 20A (only the outer shape of which is illustrated in FIG. 9) has the same or substantially the same configuration as the circuit member 10A.

The recess 121A extends over the entirety or substantially the entirety of the protective layer 12 in the Y direction. Similarly, the recess 122A extends over the entirety or substantially the entirety of the protective layer 12 in the Y direction. The relationship between the locations of the circuit member 10A and the circuit member 20A is the same or substantially the same as the relationship between the locations of the circuit member 10 and the circuit member 20 according to the first preferred embodiment.

Also with such a configuration, it is possible to obtain the same or substantially the same advantageous effects as in the first preferred embodiment. In addition, with this configuration, the insulating joining material 40 spreads on a side surface of the circuit member 10A and a side surface of the circuit member joined to the circuit member 10A. Therefore, the side surfaces of the circuit member 10A and the circuit member joined to the circuit member 10A are further joined to each other by the insulating joining material 40. As a result, the joint strength of the joint portion is further improved.

Third Preferred Embodiment

Figure 10A:
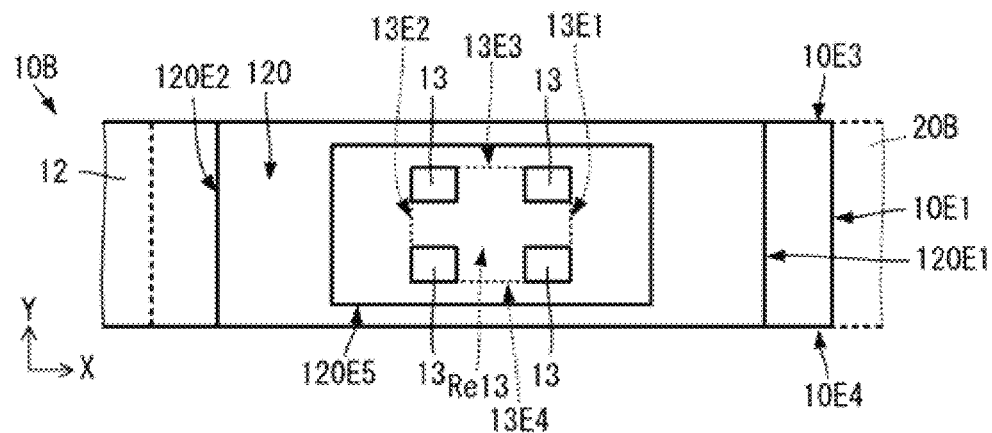
FIGS. 10A and 10B are plan views illustrating a configuration of a joint portion in circuit members 10B and 10B1.
Figure 10B:
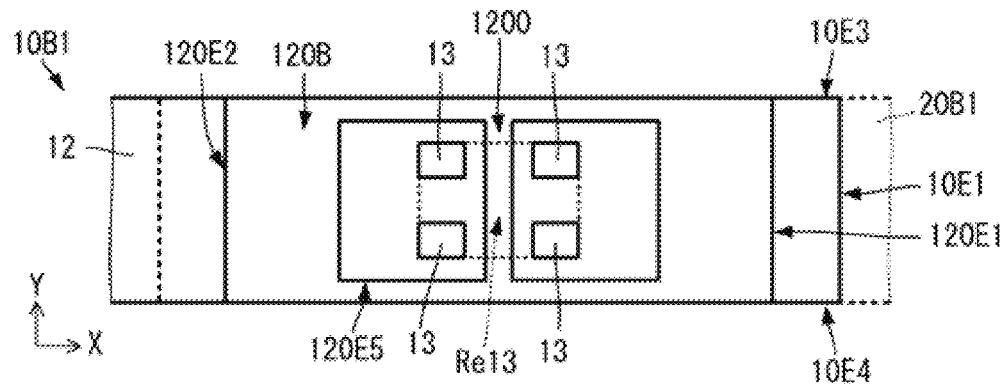

Next, a circuit member joint structure according to a third preferred embodiment of the present invention will be described with reference to the drawings. FIGS. 10A and 10B are plan views illustrating a configuration of a joint portion in circuit members 10B and 10B1.

As illustrated in FIG. 10A, the circuit member 10B in the circuit member joint structure according to the third preferred embodiment is different from the circuit member 10 according to the first preferred embodiment in that a recess 120 is provided. Other configurations of the circuit member 10B are the same or substantially the same as those of the circuit member 10, and the description of the same or similar portions will be omitted. Although not shown in FIG. 1A, a circuit member 20B (only the outer shape of which is illustrated in FIG. 10A) has the same or substantially the same configuration as the circuit member 10B.

The recess 120 has a shape that surrounds the mounting region Re13. That is, the recess 120 includes an inner end wall surface 120E5, and the plurality of mounting electrodes 13 are disposed in a region surrounded by the inner end wall surface 120E5. The relationship between the locations of the circuit member 10B and the circuit member 20B is the same or substantially the same as the relationship between the locations of the circuit member 10 and the circuit member 20 according to the first preferred embodiment.

With such a configuration, direct application of stress to the joint portion obtained by the mounting electrodes 13 can be reduced or prevented by the insulating joining material 40 provided in the recess 120, regardless of which direction the stress is applied to the circuit member 10B. As a result, the joint reliability is further improved. As illustrated in FIG. 10A, with the mounting region Re13 provided with no recess, the conductive joining material 30 and the insulating joining material 40 can be prevented from coming into contact with each other. Thus, the reliability can be prevented from being reduced due to the breaking of the interface between the conductive joining material 30 and the insulating joining material 40.

As illustrated in FIG. 10B, a circuit member 10B1 in the circuit member joint structure according to the third preferred embodiment is different from the circuit member 10B in FIG. 10A in that a recess 120B is provided. Other configurations of the circuit member 10B1 are the same or substantially the same as those of the circuit member 10B, and the description of the same or similar portions will be omitted. Although not shown in FIG. 10B, a circuit member 20B1 (only the outer shape of which is illustrated in FIG. 10B) has the same or substantially the same configuration as the circuit member 10B1.

The recess 120B further includes an auxiliary recess 1200 for the recess 120. The auxiliary recess 1200 extends in parallel or substantially in parallel with the end surface 10E1 and passes between the plurality of mounting electrodes 13. The relationship between the locations of the circuit member 10B1 and the circuit member 20B1 is the same or substantially the same as the relationship between the locations of the circuit member 10 and the circuit member 20 according to the first preferred embodiment.

With such a configuration, direct application of stress to the joint portion obtained by the mounting electrodes 13 can be reduced or prevented, regardless of which direction the stress is applied to the circuit member 10B1, as in the case of the circuit member 10B. As a result, the joint reliability is further improved. Furthermore, with the auxiliary recess 1200 provided, the insulating joining material 40 can be prevented from flowing to the interface between the mounting electrode 13 and the conductive joining material 30.

Fourth Preferred Embodiment

Figure 11A:
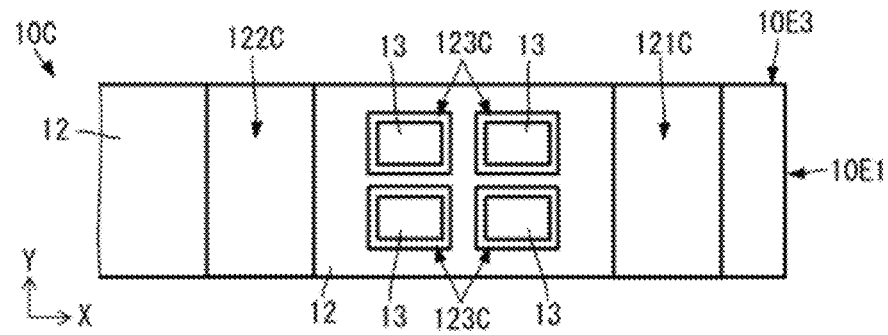
FIG. 11A is a plan view illustrating a configuration of a joint portion in a circuit member 10C.

Next, a circuit member joint structure according to a fourth preferred embodiment of the present invention will be described with reference to the drawings. FIG. 11A is a plan view illustrating the configuration of a joint portion in the circuit member 10C, and FIG. 11B is a side sectional view of the same.

Figure 11B:
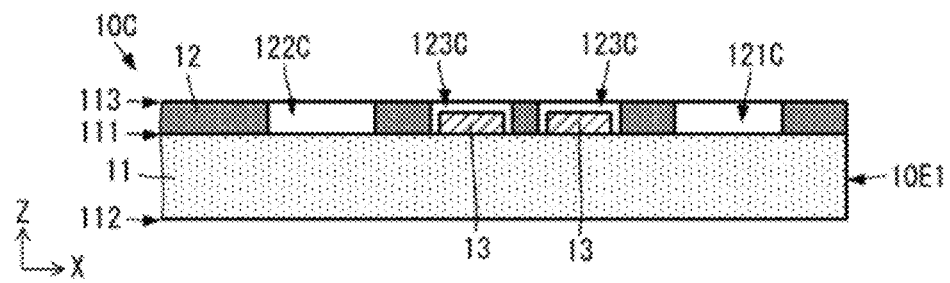
FIG. 11B is a side sectional view of the same.

As illustrated in FIGS. 11A and 11B, a circuit member 10C according to the fourth preferred embodiment is different from the circuit member 10 according to the first preferred embodiment in that a recess 121C, a recess 122C, and an auxiliary recess 123C are provided. Other configurations of the circuit member 10C are the same or substantially the same as those of the circuit member 10A, and the description of the same or similar portions will be omitted. The recess 121C is the same or substantially the same as the recess 121A, and the recess 122C is the same or substantially the same as the recess 122A. Furthermore, the following changes can be similarly made for the circuit member 20.

A plurality of the auxiliary recesses 123C are provided for the plurality of respective mounting electrodes 13. The plurality of mounting electrodes 13 are disposed inside the respective auxiliary recesses 123C. This configuration can be achieved by providing cavities (corresponding to a "first opening" of the present invention) including the mounting electrodes 13, in the protective layer 12.

With such a configuration, a large joint area of the conductive joining material 30 can be achieved in the mounting electrodes 13. This improves the reliability of electrical and physical joining in the circuit member joint structure. Furthermore, with the auxiliary recess 123C, the insulating joining material 40 can be more effectively prevented from flowing to the interface between the mounting electrode 13 and the conductive joining material 30. This further improves the reliability of electrical and physical joining in the circuit member joint structure.

Figure 12:
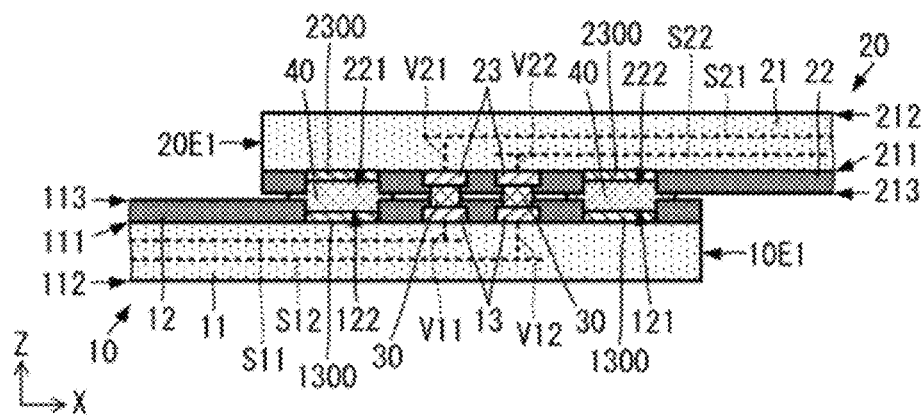
FIG. 12 is a side sectional view illustrating a joint structure of circuit members 10 and 20 which is a modified example of a preferred embodiment of the present invention.

Although no electrode is provided at the bottom of the recess in each of configurations of the above-described preferred embodiments, as illustrated in FIG. 12, an electrode may be provided at the bottom of the recess. FIG. 12 is a side sectional view illustrating a circuit member joint structure which is a modified example of a preferred embodiment of the present invention.

As illustrated in FIG. 12, a circuit member 10 includes an electrode 1300. The electrode 1300 can be defined by, for example, an electrode that is electrically independent of the signal electrodes S11 and S22 or the like, or can be defined by a portion of the ground electrode. The electrode 1300 is provided at the bottom of the recess 121 and the bottom of the recess 122. The thickness of the electrode 1300 is equal to or less than the thickness of the mounting electrode 13. A circuit member 20 includes an electrode 2300. The electrode 2300 is provided at the bottom of the recess 221 and the bottom of the recess 222. The thickness of the electrode 2300 is equal to or less than the thickness of the mounting electrode 23. Also with such a configuration, the above-described advantageous effects can be obtained.

Fifth Preferred Embodiment

Figure 13:
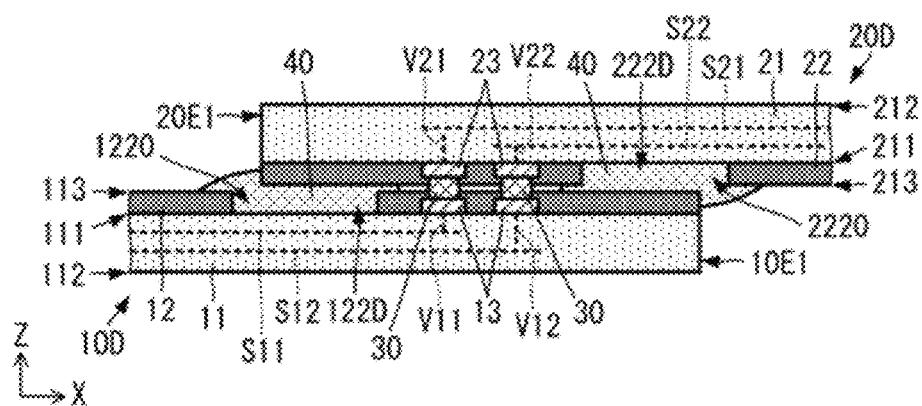
FIG. 13 is a side sectional view illustrating a configuration of a joint portion of circuit members 10D and 20D.
Figure 14:
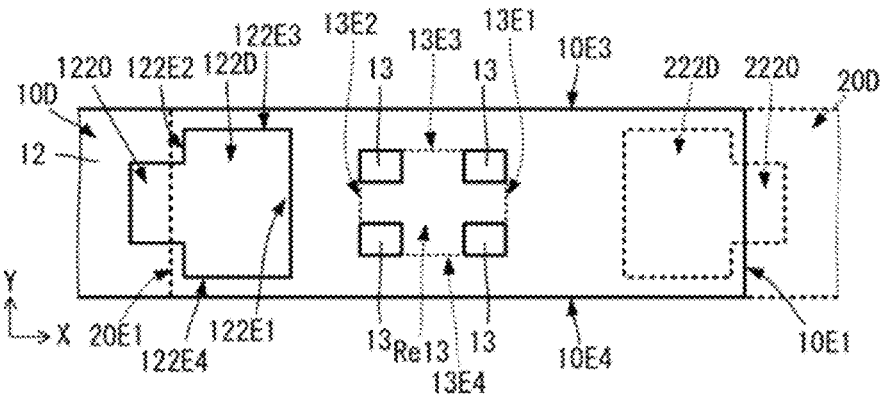
FIG. 14 is a plan view illustrating a configuration of a joint portion of a circuit member 10D.

Next, a circuit member joint structure according to a fifth preferred embodiment of the present invention will be described with reference to the drawings. FIG. 13 is a side sectional view illustrating a configuration of a joint portion of circuit members. FIG. 14 is a plan view illustrating a configuration of a joint portion of circuit members.

As illustrated in FIGS. 13 and 14, a circuit member 10D according to the fifth preferred embodiment is different from the circuit member 10 according to the first preferred embodiment in that an inflow port 1220 is provided and that the recess 121 is not provided. The circuit member 20D according to the fifth preferred embodiment is different from the circuit member 20 according to the first preferred embodiment in that an inflow port 2220 is provided and that the recess 221 is not provided. The circuit member 10D may include the recess 121, and the circuit member 20D may include the recess 221.

The recess 122D is the same or substantially the same as the recess 122, and the recess 222D is the same or substantially the same as the recess 222. The other configurations of the circuit member 10D are the same or substantially the same as those of the circuit member 10, and the other configurations of the circuit member 20D are the same or substantially the same as those of the circuit member 20. Thus, the description of the same or similar portions will be omitted.

The inflow port 1220 is defined by a recess recessed from the main surface of the circuit member 10D (here, the front surface 113 of the protective layer 12) in the thickness direction of the circuit member 10D. The inflow port 1220 corresponds to a "first inflow port". Specifically, the inflow port 1220 is formed by removing the protective layer 12 on the main surface of the circuit member 10D. Similarly, the recess 122D is also formed by removing the protective layer 12 on the main surface of the circuit member 10D. For example, the recess 122D and the inflow port 1220 are formed by etching the protective layer 12 using a pattern in which the recess 122D and the inflow port 1220 are connected.

The inflow port 1220 is provided on the side of the recess 122D opposite to the side of the group of mounting electrodes 13, and is connected to the recess 122D.

The inflow port 1220 is rectangular or substantially rectangular in plan view, and the length (width) of the inflow port 1220 in the Y direction (the lateral direction of the circuit member 10D) is shorter than the length (width) of the recess 122D in the Y direction. Furthermore, the inflow port 1220 includes a central or substantially central position of the recess 122D in the Y direction.

Furthermore, in a state where the mounting electrode 13 of the circuit member 10D and the mounting electrode 23 of the circuit member 20D are overlapped with each other, a portion of the inflow port 1220 does not overlap with the circuit member 20D. In other words, in plan view, the inflow port 1220 and the end surface 20E1 of the circuit member 20D partially overlap.

The inflow port 2220 is defined by a recess recessed from the main surface of the circuit member 20D (here, the front surface 213 of the protective layer 22) in the thickness direction of the circuit member 20D.

The inflow port 2220 corresponds to a "second inflow port". Specifically, the inflow port 2220 is formed by removing the protective layer 22 on the main surface of the circuit member 20D. Similarly, the recess 222D is also formed by removing the protective layer 22 on the main surface of the circuit member 20D. For example, the recess 222D and the inflow port 2220 are formed by etching the protective layer 22 using a pattern in which the recess 222D and the inflow port 2220 are connected.

The inflow port 2220 is provided on the side of the recess 222D opposite to the side of the group of mounting electrodes 23, and is connected to the recess 222D.

The inflow port 2220 is rectangular or substantially rectangular in plan view, and the length (width) of the inflow port 2220 in the Y direction (the lateral direction of the circuit member 20D) is shorter than the length (width) of the recess 222D in the Y direction. Furthermore, the inflow port 2220 includes a central or substantially central position of the recess 222D in the Y direction.

Furthermore, in a state where the mounting electrode 13 of the circuit member 10D and the mounting electrode 23 of the circuit member 20D are overlapped with each other, a portion of the inflow port 2220 does not overlap with the circuit member 10D. In other words, in plan view, the inflow port 2220 and the end surface 10E1 of the circuit member 10D partially overlap.

With such a configuration, when the above-described second joining method is used, the insulating joining material 40 can be easily injected into the recess 122D through the inflow port 1220. Similarly, the insulating joining material 40 can be easily injected into the recess 222D through the inflow port 2220.

Furthermore, the insulating joining material 40 is injected into the portion of the inflow port 1220 that overlaps with the circuit member 20D and the portion of the inflow port 2220 that overlaps with the circuit member 10D. As a result, the joint area is increased and the joint strength is improved. Furthermore, as illustrated in FIG. 13, in this configuration, the insulating joining material 40 also spreads to the end surface 10E1 of the circuit member 10D and the end surface 20E1 of the circuit member 20D. Therefore, the joint area is further increased and the joint strength is further improved.

Furthermore, the recess 122D and the inflow port 1220 can be formed on the circuit member 10D simply by removing the protective layer 12. Therefore, the recess 122D and the inflow port 1220 can be easily formed. Similarly, the recess 222D and the inflow port 2220 can be formed on the circuit member 20D simply by removing the protective layer 22.

Therefore, the recess 222D and the inflow port 2220 can be easily formed.

With such a structure, the following joining method can be adopted.

Third Joining Method

FIGS. 15A to 15D are diagrams each illustrating a state in a certain step in a non-limiting example of the third joining method.

Figure 15A:
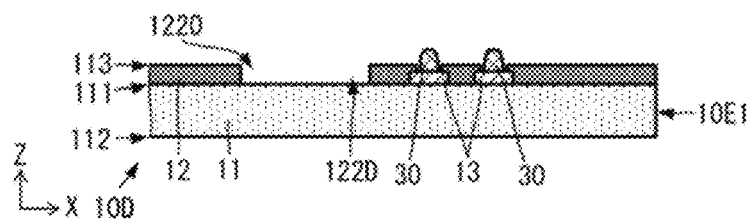
FIGS. 15A to 15D are diagrams each illustrating a state in a certain step in a third joining method.

First, the circuit member 10D is prepared, and the cavity on the mounting electrode 13 is pre-coated with solder which is the conductive joining material 30 as illustrated in FIG. 15A. In this process, the pre-coating solder is provided up to a height high enough to protrude outward from the main surface of the circuit member 10D (here, the front surface 113 of the protective layer 12).

Figure 15B:
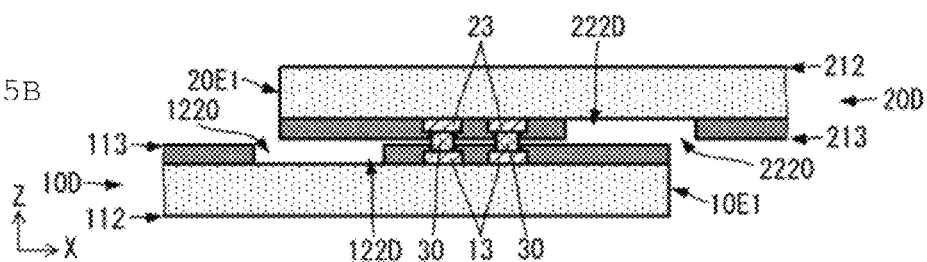

Next, the circuit member 20D is arranged while being aligned with the circuit member 10D. In this process, as illustrated in FIG. 15B, the circuit member 20D is arranged relative to the circuit member 10D, with the mounting electrode 13 facing the mounting electrode 23. Furthermore, the circuit member 20D and the circuit member 10D are arranged such that the recess 122D overlaps the circuit member 20D, at least a portion of the inflow port 1220 does not overlap the circuit member 20D, the recess 222D does not overlap the circuit member 10D, and at least a portion of the inflow port 2220 does not overlap the circuit member 10D.

Next, heating is performed for the conductive joining material 30 in a state where the circuit member 10D and the circuit member 20D are aligned. The heating for the conductive joining material 30 is performed, for example, using a reflow, an oven, or a hot bar. Thus, the mounting electrode 13 and the mounting electrode 23 are physically and electrically joined to each other via the conductive joining material 30. When solder with a melting point of about 130° C. to about 210° C. is used as the conductive joining material 30, the maximum temperature of the heating may be about 240° C., for example.

Figure 15C:
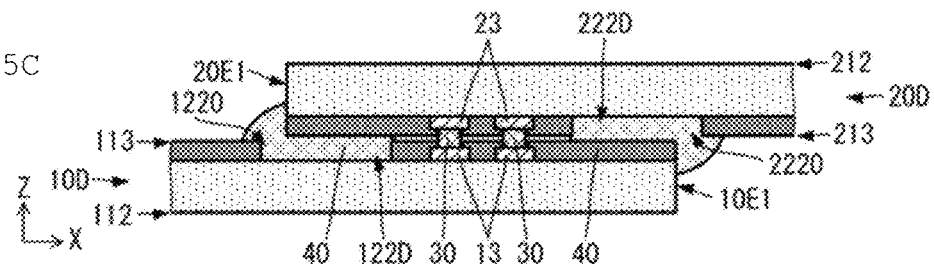

Next, as illustrated in FIG. 15C, the insulating joining material 40 is injected into the gap between the circuit member 10D and the circuit member 20D, between the recess 122D and the circuit member 20D, and between the recess 222D and the circuit member 10D, through the inflow port 1220 and the inflow port 2220.

Figure 15D:
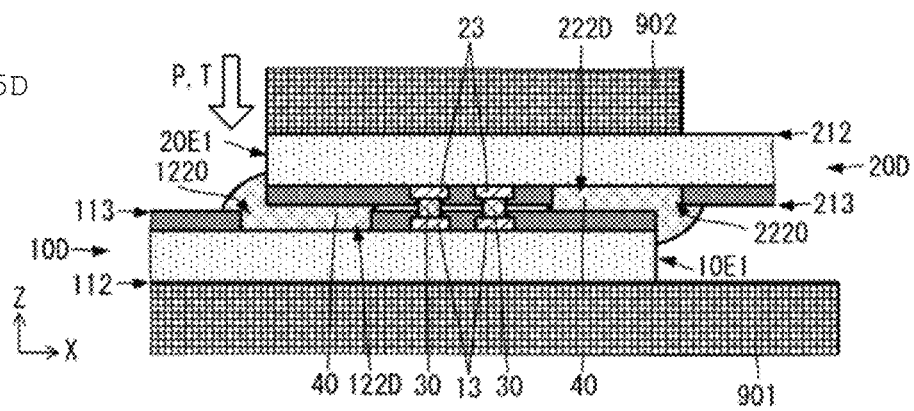

Next, heat pressing (heating and pressing) is performed for the insulating joining material 40. More specifically, as illustrated in FIG. 15D, the base substrate 901 for the heat pressing is brought into contact with the main surface 112 of the circuit member 10D. Furthermore, the heat pressing member 902 is brought into contact with the main surface 212 of the circuit member 20D. In this state, at least one of the base substrate 901 and the heat pressing member 902 is heated, and the heat pressing member 902 is pushed toward the base substrate 901. The heating temperature for the insulating joining material 40 may be, for example, about 140° C., and the duration of the heating may be about 15 minutes, for example.

With this configuration, the main surface of the circuit member 10 (here, the front surface 113 of the protective layer 12) and the main surface of the circuit member 20 (here, the front surface 213 of the protective layer 22) are close to each other or in contact with each other. The insulating joining material 40 is cured by the heating. As a result, the circuit member 10 and the circuit member 20 are physically joined to each other.

With the inflow port 1220 and the inflow port 2220 provided, even if the circuit member 10D and the circuit member 20D close to each other or in contact with each other, the insulating joining material 40 can easily flow between the recess 222D and the circuit member 10D and between the inflow port 1220 and the inflow port 2220.

Furthermore, at the time of joining, the insulating joining material 40 may flow back to the inflow port 1220 and the inflow port 2220 to fill the inflow port 1220 and the inflow port 2220. Still, a portion of the inflow port 1220 overlaps the circuit member 20D and a portion of the inflow port 2220 overlaps the circuit member 10D, such that the joint area can be increased with the insulating joining material 40 filling the inflow port 1220 and the inflow port 2220 contributing to the joining between the circuit member 10D and the circuit member 20D.

Sixth Preferred Embodiment

Figure 16:
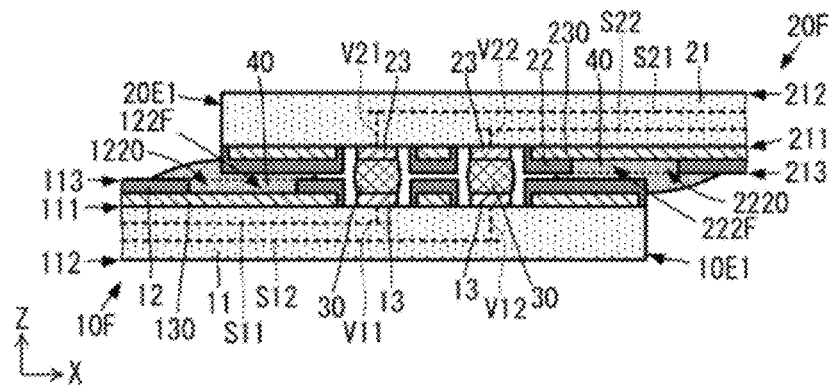
FIG. 16 is a side sectional view illustrating a configuration of a joint portion of circuit members 10F and 20F.

Next, a circuit member joint structure according to a sixth preferred embodiment of the present invention will be described with reference to the drawings. FIG. 16 is a side sectional view illustrating a configuration of a joint portion of circuit members 10F and 20F.

As illustrated in FIG. 16, a circuit member 10F according to the sixth preferred embodiment is different from the circuit member 10D according to the fifth preferred embodiment in that the main surface 111 is provided with a ground electrode 130. The circuit member 20F according to the sixth preferred embodiment is different from the circuit member 20D according to the fifth preferred embodiment in that the main surface 211 is provided with a ground electrode 230. The recess 122F is the same or substantially the same as the recess 122D, and the recess 222F is the same or substantially the same as the recess 222D. The other configurations of the circuit member 10F are the same or substantially the same as those of the circuit member 10D, and the other configurations of the circuit member 20F are the same or substantially the same as those of the circuit member 20D. Thus, the description of the same or similar portions will be omitted.

As illustrated in FIG. 16, the circuit member 10F includes a ground electrode 130.

The ground electrode 130 is provided over the entirety or substantially the entirety of the main surface 111 except for the region where the mounting electrode 13 is provided. The ground electrode 130 and the mounting electrode 13 are physically and electrically separated from each other.

In such a configuration, the recess 122F and the inflow port 1220 are provided by partially removing the protective layer 12 that covers the front surface of the ground electrode 130.

Further, as illustrated in FIG. 16, the circuit member 20F includes the ground electrode 230. The ground electrode 230 is provided over the entirety or substantially the entirety of the main surface 211 except for the region where the mounting electrode 23 is formed. The ground electrode 230 and the mounting electrode 23 are physically and electrically separated from each other.

In such a configuration, the recess 222F and the inflow port 2220 are provided by removing the protective layer 22 that covers the front surface of the ground electrode 230.

In such a configuration, the rigidity of the joint portion can be increased because the ground electrode 130 and the ground electrode 230 are provided. Therefore, the stress is less likely to be transmitted to the joint portion between the mounting electrode 13 and the mounting electrode 23, such that the reliability of the joint of this portion is improved.

Furthermore, in this configuration, in the circuit member 10F, the length of the inflow port 1220 in the Y direction is shorter than the length of the recess 122F in the Y direction. In this case, the area where the ground electrode 130 is directly exposed to the outside can be small in a state before the insulating joining material 40 is injected. Thus, unwanted reactions such as oxidation of the ground electrode 130 can be reduced or prevented, such that reliability is improved.

Similarly, in this configuration, in the circuit member 20F, the length of the inflow port 2220 in the Y direction is shorter than the length of the recess 222F in the Y direction. In this case, the area where the ground electrode 230 is directly exposed to the outside can be small in a state before the insulating joining material 40 is injected. Thus, unwanted reactions such as oxidation of the ground electrode 230 can be reduced or prevented, such that reliability is improved.

Furthermore, in this configuration, the insulating joining material 40 comes into contact with the ground electrode 130 and the ground electrode 230. Therefore, by using a material that can achieve good joining with metal for the insulating joining material 40, the joint strength of the insulating joining material 40 is improved, and reliability of the electrical and physical connection between the circuit member 10F and the circuit member 20F can be improved.

Furthermore, with this configuration, it is possible to prevent the region where the ground electrode 130 and the signal electrode S11 overlap from being partially eliminated, stable impedance of the transmission line including the signal electrode S11 can be achieved, and resistance of the signal electrode S11 against noise can be improved. Similarly, with this configuration, it is possible to prevent the region where the ground electrode 230 and the signal electrode S22 overlap from being partially eliminated, stable impedance of the transmission line including the signal electrode S22 can be achieved, and resistance of the signal electrode S22 against noise can be improved.

Seventh Preferred Embodiment

Figure 17:
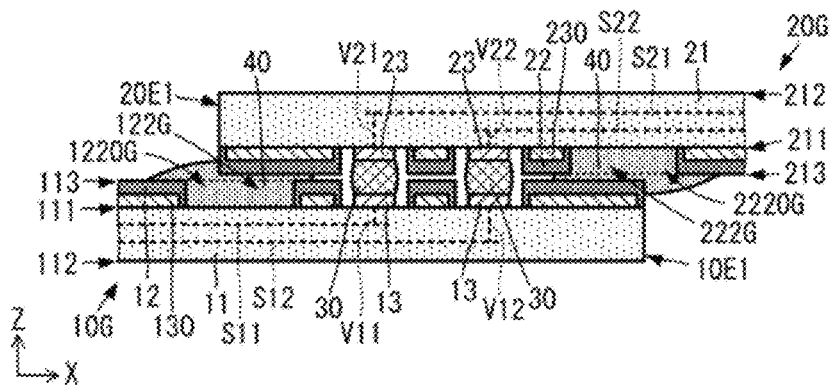
FIG. 17 is a side sectional view illustrating a configuration of a joint portion of circuit members 10G and 20G.

Next, a circuit member joint structure according to a seventh preferred embodiment of the present invention will be described with reference to the drawings. FIG. 17 is a side sectional view illustrating a configuration of a joint portion of circuit members 10G and 20G.

As illustrated in FIG. 17, the circuit member 10G according to the seventh preferred embodiment is different from the circuit member 10F according to the sixth preferred embodiment in the shapes of a recess 122G and an inflow port 1220G. The circuit member 20G according to the seventh preferred embodiment is different from the circuit member 20F according to the sixth preferred embodiment in the shapes of a recess 222G and an inflow port 2220G. The other configurations of the circuit member 10G are the same or substantially the same as those of the circuit member 10F, and the other configurations of the circuit member 20G are the same or substantially the same as those of the circuit member 20F. Thus, the description of the same or similar portions will be omitted.

As illustrated in FIG. 17, the recess 122G and the inflow port 1220G are formed by removing the protective layer 12 and the ground electrode 130. In other words, the depth of the recess 122G and the inflow port 1220G is the same or substantially the same as the sum of the thickness of the protective layer 12 and the thickness of the ground electrode 130. In plan view, the shape of the recess 122G is the same or substantially the same as that of the recess 122F, and the shape of the inflow port 1220G is the same or substantially the same as that of the inflow port 1220.

The recess 222G and the inflow port 2220G are formed by removing the protective layer 22 and the ground electrode 230. In other words, the depth of the recess 222G and the inflow port 2220G is the same or substantially the same as the sum of the thickness of the protective layer 22 and the thickness of the ground electrode 230. In plan view, the shape of the recess 222G is the same or substantially the same as that of the recess 222F, and the shape of the inflow port 2220G is the same or substantially the same as that of the inflow port 2220.

With such a configuration, the depth of the recess 122G and the inflow port 1220G and the depth of the recess 222G and the inflow port 2220G can be large. Furthermore, this configuration does not include the ground electrode 130 of the recess 122G and the inflow port 1220G, such that unwanted capacitive coupling between the ground electrode and another electrode in the recess 122G and the inflow port 1220G can be prevented. Similarly, this configuration does not include the ground electrode 230 of the recess 222G and the inflow port 2220G, such that unwanted capacitive coupling between the ground electrode and another electrode in the recess 222G and the inflow port 2220G can be prevented.

Eighth Preferred Embodiment

Figure 18:
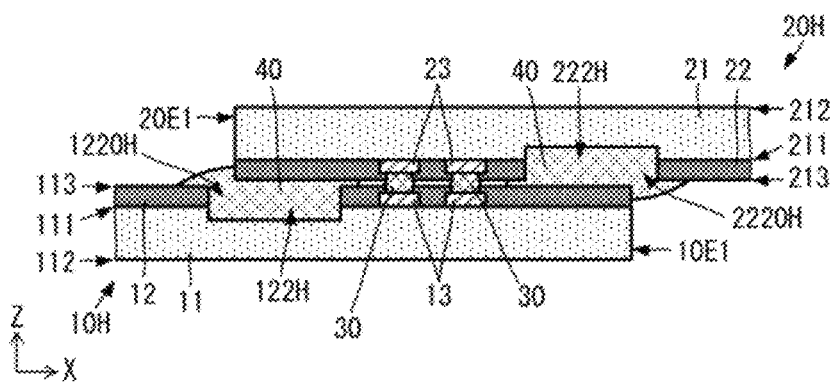
FIG. 18 is a side sectional view illustrating a configuration of a joint portion of circuit members 10H and 20H.

Next, a circuit member joint structure according to an eighth preferred embodiment of the present invention will be described with reference to the drawings. FIG. 18 is a side sectional view illustrating a configuration of a joint portion of circuit members 10H and 20H.

As illustrated in FIG. 18, the circuit member 10H according to the eighth preferred embodiment is different from the circuit member 10D according to the fifth preferred embodiment in the shapes of a recess 122H and an inflow port 1220H.

Similarly, the circuit member 20H according to the eighth preferred embodiment is different from the circuit member 20D according to the fifth preferred embodiment in the shapes of a recess 222H and an inflow port 2220H. The other configurations of the circuit member 10H are the same or substantially the same as those of the circuit member 10D, and the other configurations of the circuit member 20H are the same or substantially the same as those of the circuit member 20D. Thus, the description of the same or similar portions will be omitted.

As illustrated in FIG. 18, the recess 122H and the inflow port 1220H are formed by removing a portion of a predetermined depth from the main surface 111 in the protective layer 12 and the substrate 11. In other words, the depth of the recess 122H and the inflow port 1220H is greater than the thickness of the protective layer 12. In plan view, the shape of the recess 122H is the same as that of the recess 122D, and the shape of the inflow port 1220H is the same or substantially the same as that of the inflow port 1220.

As illustrated in FIG. 18, the recess 222H and the inflow port 2220H are formed by removing a portion of a predetermined depth from the main surface 211 in the protective layer 22 and the substrate 21. In other words, the depth of the recess 222H and the inflow port 2220H is greater than the thickness of the protective layer 22. In plan view, the shape of the recess 222H is the same or substantially the same as that of the recess 222D, and the shape of the inflow port 2220H is the same or substantially the same as that of the inflow port 2220.

With such a configuration, the depth of the recess 122H and the inflow port 1220H and the depth of the recess 222H and the inflow port 2220H can be further increased.

Ninth Preferred Embodiment

Figure 19:
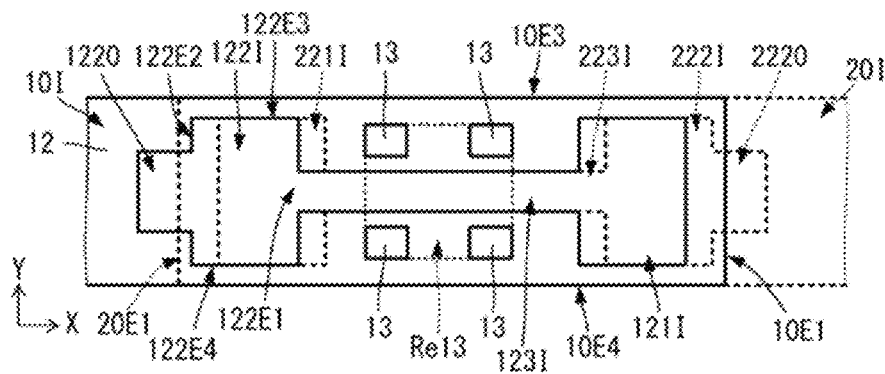
FIG. 19 is a plan view illustrating a configuration of a joint portion of a circuit member 10I.

Next, a circuit member joint structure according to a ninth preferred embodiment of the present invention will be described with reference to the drawings. FIG. 19 is a plan view illustrating a configuration of a joint portion of a circuit member 10I.

As illustrated in FIG. 19, the circuit member 10I according to the ninth preferred embodiment is different from the circuit member 10D according to the fifth preferred embodiment in that a recess 121I and an auxiliary recess 123I are provided. The circuit member 20I according to the ninth preferred embodiment is different from the circuit member 20D according to the fifth preferred embodiment in that a recess 221I and an auxiliary recess 223I are provided. The recess 122I is the same or substantially the same as the recess 122D, and the recess 222I is the same or substantially the same as the recess 222D. The other configurations of the circuit member 10I are the same or substantially the same as those of the circuit member 10D, and the other configurations of the circuit member 20I are the same or substantially the same as those of the circuit member 20D. Thus, the description of the same or similar portions will be omitted.

The recess 121I is provided between the end surface 10E1 and the mounting region Re13 in the circuit member 10I. Thus, the recess 121I is provided at the same or substantially the same position as the recess 121 according to the first preferred embodiment. The recess 121I has the same or substantially the same shape as the recess 121.

The auxiliary recess 123I has a shape extending along the X direction (longitudinal direction of the circuit member 10I). The auxiliary recess 123I is provided between the plurality of mounting electrodes 13. The auxiliary recess 123I includes one end connected to the recess 122I, and includes the other end connected to the recess 121I.

The recess 221I is provided between the end surface 20E1 and a region (region overlapping the mounting region Re13) of the mounting electrode 23 (see FIG. 1, not illustrated in FIG. 18) in the circuit member 20I. Thus, the recess 221I is provided at the same or substantially location as the recess 221 according to the first preferred embodiment. The recess 221I has the same or substantially the same shape as the recess 221.

The auxiliary recess 223I has a shape extending along the X direction (longitudinal direction of the circuit member 20I). The auxiliary recess 223I is provided between the plurality of mounting electrodes 23. The auxiliary recess 223I include one end connected to the recess 222I, and includes the other end connected to the recess 221I.

In such a configuration, the insulating joining material 40 is provided on both sides of a region (mounting region Re13) of the plurality of mounting electrodes 13 and a region of the plurality of mounting electrodes 23 in the X direction. Furthermore, the insulating joining material 40 is also provided between the plurality of mounting electrodes 13 and between the plurality of mounting electrodes 23.

As a result, the joint strength between the circuit member 10I and the circuit member 20I is further improved, and the reliability of the electrical and physical connection between the circuit member 10I and the circuit member 20I is further improved. Further, as compared with the configuration not including the auxiliary recess 223I, the insulating joining material 40 can easily flow between the plurality of mounting electrodes 13 and between the plurality of mounting electrodes 23.

Tenth Preferred Embodiment

Figure 20A:
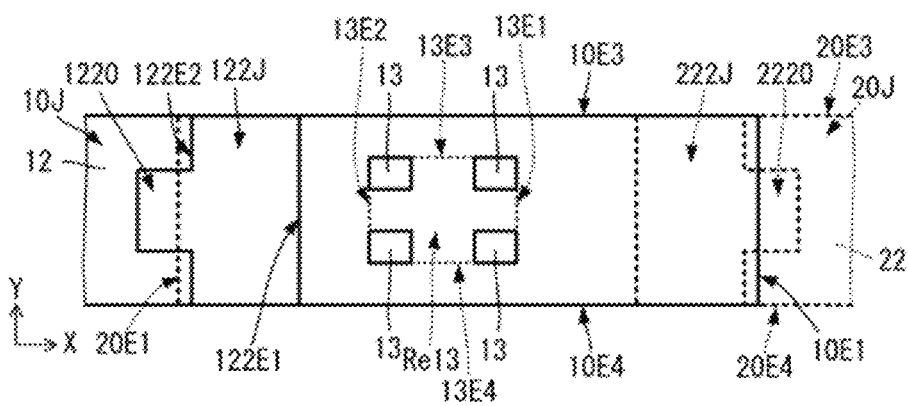
FIG. 20A is a plan view illustrating the configuration of a joint portion in a circuit member 10J.

Next, a circuit member joint structure according to a tenth preferred embodiment of the present invention will be described with reference to the drawings. FIG. 20A is a plan view illustrating the configuration of a joint portion in the circuit member 10J, and FIG. 20B is a plan view illustrating a spreading state of the insulating joining material 40.

Figure 20B:
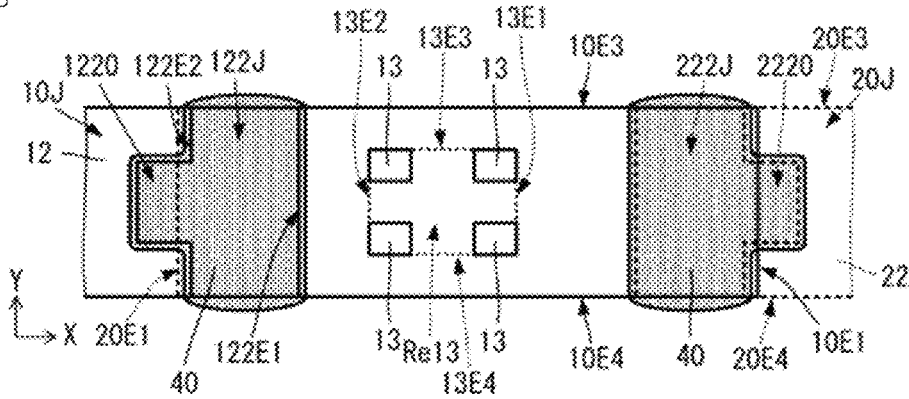
FIG. 20B is a plan view illustrating a spreading state of an insulating joining material 40.

As illustrated in FIGS. 20A and 20B, the circuit member 10J according to the tenth preferred embodiment is different from the circuit member 10D according to the fifth preferred embodiment in the shape of a recess 122J. A circuit member 20J according to the tenth preferred embodiment is different from the circuit member 20D according to the fifth preferred embodiment in the shape of a recess 222J. The other configurations of the circuit member 10J are the same as those of the circuit member 10D, and the other configurations of the circuit member 20J are the same or substantially the same as those of the circuit member 20D. Thus, the description of the same or similar portions will be omitted.

The recess 122J of the circuit member 10J extends over the entirety or substantially the entirety of the protective layer 12 in the Y direction (width direction). Similarly, the recess 222J of the circuit member 20J extends over the entirety or substantially the entirety of the protective layer 22 in the Y direction (width direction).

In such a configuration, as illustrated in FIG. 20B, the insulating joining material 40 further spreads to a side surface (end surface 10E3, end surface 10E4) of the circuit member 10J and a side surface (end surface 20E3, end surface 20E4) of the circuit member 20J. Therefore, the side surfaces of the circuit member 10J and the circuit member 20J are further joined to each other by the insulating joining material 40. As a result, the joint strength of the joint portion is further improved.

Eleventh Preferred Embodiment

Figure 21A:
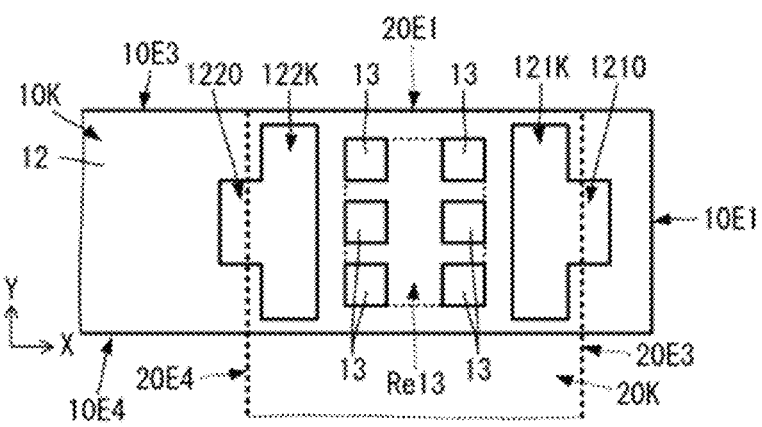
FIG. 21A is a plan view illustrating a configuration of a joint portion in a circuit member 10K.

Next, a circuit member joint structure according to an eleventh preferred embodiment of the present invention will be described with reference to the drawings. FIG. 21A is a plan view illustrating the configuration of a joint portion in a circuit member 10K, and FIG. 21B is a side sectional view of the same.

Figure 21B:
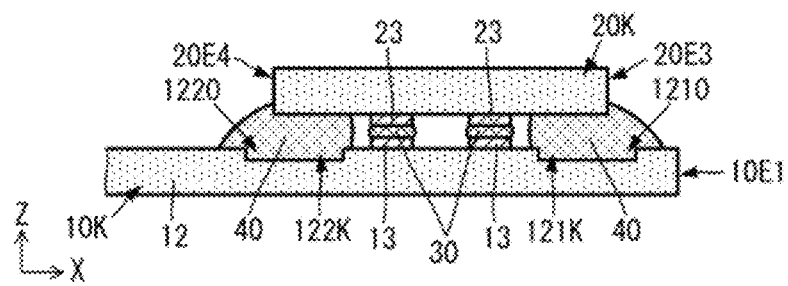
FIG. 21B is a side sectional view of the same.

As illustrated in FIGS. 21A and 21B, the circuit member 10K according to the eleventh preferred embodiment is different from the circuit member 10D according to the fifth preferred embodiment in that the recess 121K is provided, and in the positional relationship of the circuit member 10K and a circuit member 20K. The recess 122K is the same or substantially the same as the recess 122D. Other configurations of the circuit member 10K are the same or substantially the same as those of the circuit member 10D, and the description thereof will be omitted.

The circuit member 20K does not include a recess into which the insulating joining material 40 enters. The basic configuration of the circuit member 20K excluding the recess is the same or substantially the same as that of the circuit member 20D, and the description on the same or similar portions will be omitted.

The recess 121K of the circuit member 10K is disposed between the mounting region Re13 and the end surface 10E1. The recess 121K is rectangular or substantially rectangular and has the same or substantially the same depth as the recess 122K. The inflow port 1210 is provided on the end surface 10E1 side of the recess 121K and is connected to the recess 121K. The inflow port 1210 has the same or substantially the same depth as the recess 121K. The length of the inflow port 1210 in the Y direction is shorter than the length of the recess 121K in the Y direction.

In other words, a recessed portion including the recess 121K and the inflow port 1210 has a shape as a result of inverting a recessed portion including the recess 122K and the inflow port 1220 in plan view. The mounting region Re13 is disposed between the recessed portion including the recess 121K and the inflow port 1210 and the recessed portion including the recess 122K and the inflow port 1220.

The circuit member 10K is arranged to include the longitudinal direction extending in parallel or substantially parallel to the X direction and to include the lateral direction extending in parallel or substantially in parallel to the Y direction. The circuit member 20K is arranged to include the longitudinal direction extending in parallel or substantially parallel to the Y direction and to include the lateral direction extending in parallel or substantially in parallel to the X direction.

The circuit member 10K and the circuit member 20K are arranged so that the mounting electrode 13 and the mounting electrode 23 overlap each other in plan view.

With this configuration, in plan view, the circuit member 20K overlaps with the entirety or substantially the entirety of the recess 121K and the entirety or substantially the entirety of the recess 122K, and overlaps with a portion of the inflow port 1210 on the recess 121K side and a portion of the inflow port 1220 on the recess 122K side. In other words, the circuit member 20K is arranged so as not to overlap with a portion of the inflow port 1210 opposite to the recess 121K side and a portion of the inflow port 1220 opposite to the recess 122K side.

The insulating joining material 40 is injected into the recess 121K via the inflow port 1210 and into the recess 122K via the inflow port 1220. Then, the insulating joining material 40 joins the circuit member 10K and the circuit member 20K to each other.

In such a configuration, the insulating joining material 40 can be injected from the circuit member 20K side into both of the recess 121K and the recess 122K that sandwich the mounting region Re13. Thus, a structure having high joint strength can be obtained by a simple process. The insulating joining material 40 can be injected into a member in which the circuit member 10K and the circuit member 20K are overlapped through a single process without turning the member upside down during the injection.

Twelfth Preferred Embodiment

Figure 22:
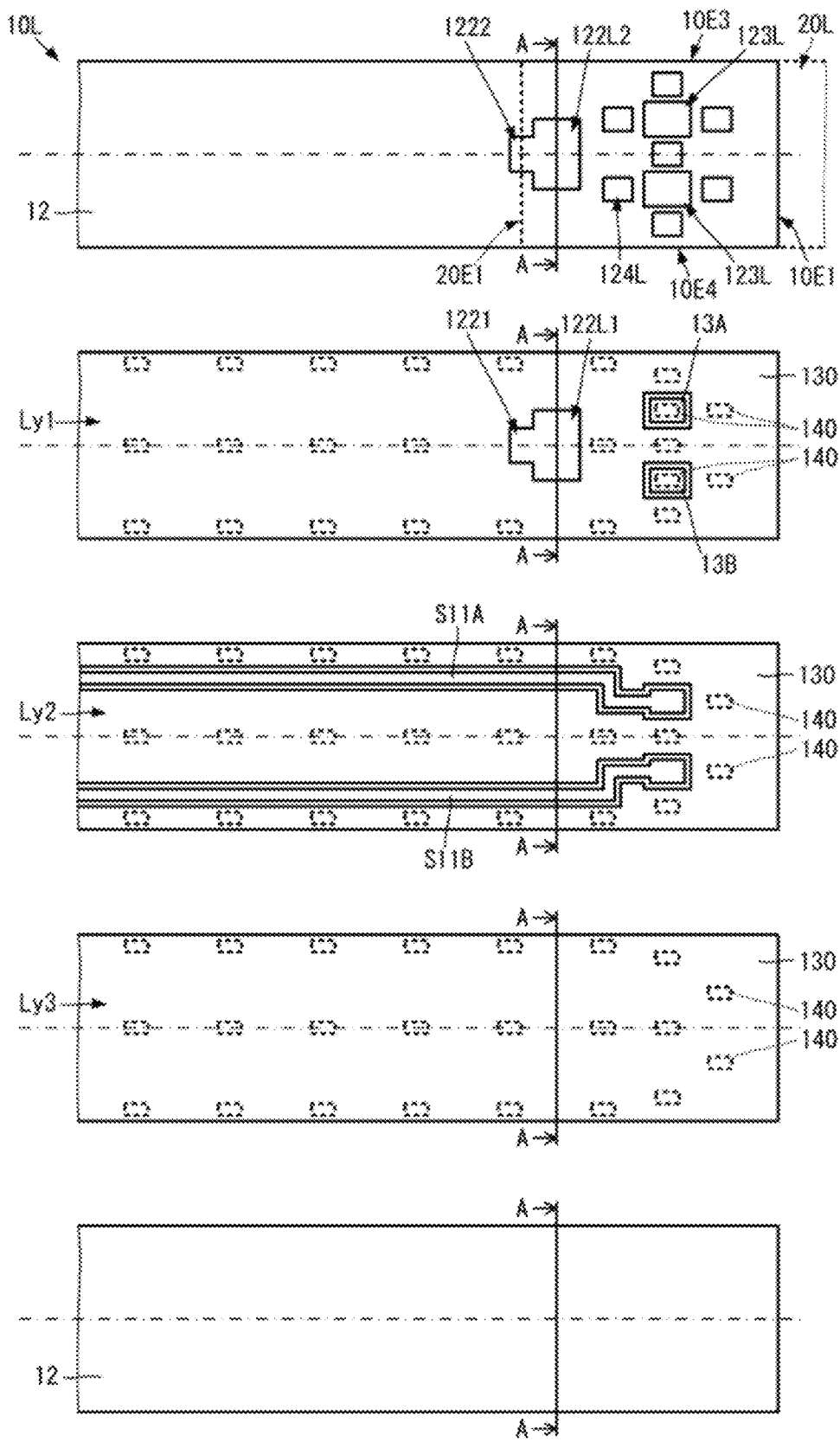
FIG. 22 is an exploded plan view illustrating a portion of a circuit member 10L on the joint portion side.
Figure 23:
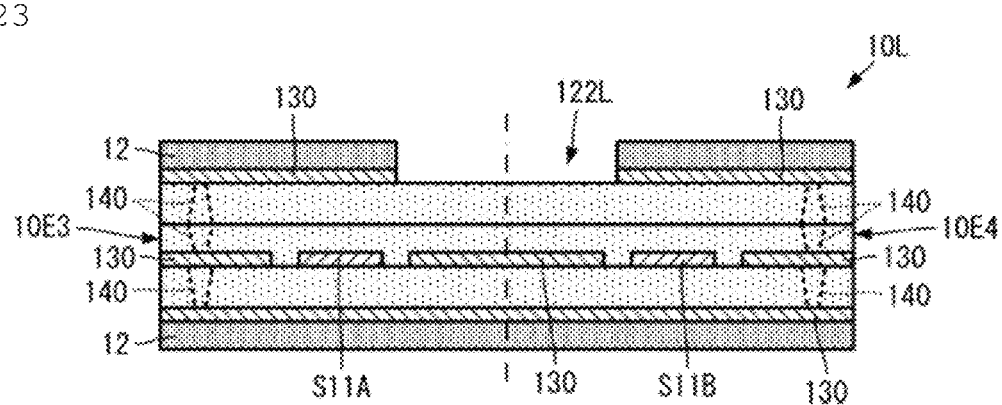
FIG. 23 is a sectional view taken along line A-A in FIG. 22.

Next, a circuit member joint structure according to a twelfth preferred embodiment of the present invention will be described with reference to the drawings. FIG. 22 is an exploded plan view illustrating a part of the circuit member 10L on the joint portion side. FIG. 23 is a sectional view taken along line A-A in FIG. 22.

The circuit member 10L according to the twelfth preferred embodiment is different from the circuit member 10D according to the fifth preferred embodiment in the arrangement of mounting electrodes 13A and 13B and in the shapes of signal electrodes S11A and S11B. The basic structure of the circuit member 10L is the same or substantially the same as that of the circuit member 10D, and the description thereof will be omitted. Furthermore, the basic structure of the joint between the circuit member 10L and the circuit member 20L is the same or substantially the same as the joint structure of the circuit member 10D and the circuit member 20D in the fifth preferred embodiment, and the description thereof will be omitted.

The circuit member 10L is formed by stacking an insulating resin layer Ly1, an insulating resin layer Ly2, and an insulating resin layer Ly3. This stack corresponds to the substrate 11 of the circuit member 10D. The protective layers 12 are provided on the front surface and the back surface of the stack.

The mounting electrode 13A, the mounting electrode 13B, and the ground electrode 130 are provided on the front surface of the insulating resin layer Ly1. The mounting electrode 13A and the mounting electrode 13B are rectangular or substantially rectangular in a plan view and are provided in the vicinity of the end surface 10E1 in the insulating resin layer Ly1. The ground electrode 130 is provided over the entirety or substantially the entirety of the front surface of the insulating resin layer Ly1 excluding a region of the mounting electrode 13A and the mounting electrode 13B, and is separated from the mounting electrode 13A and the mounting electrode 13B.

The ground electrode 130 is provided with a no electrode portion 122L1 and a no electrode portion 122I. The no electrode portion 122L1 of the no electrode portion 122I are connected to each other.

The protective layer 12 on the front surface of the insulating resin layer Ly1 is provided with a plurality of openings 123L to mount electrodes and a plurality of openings 124L for the ground, each of which is defined by a no protective layer portion. The protective layer 12 on the front surface of the insulating resin layer Ly1 is provided with a no protective layer portion 122L2 and a no protective layer portion 1222. The no protective layer portion 122L2 and the no protective layer portion 1222 are connected to each other.

In plan view, the no protective layer portion 122L2 overlaps with the no electrode portion 122L1, and this structure defines the recess 122L. In plan view, the no protective layer portion 122² overlaps with the no electrode portion 122I, and this structure defines an inflow port connected to the recess 122L.

In plan view, the mounting electrode 13A and the mounting electrode 13B are each disposed inside the opening 123L for the mounting electrode. The plurality of openings 124L for the ground surround the openings 123L for the mounting electrodes.

The signal electrode S11A, the signal electrode S11B, and the ground electrode 130 are provided on the back surface of the insulating resin layer Ly2. The signal electrode S11A and the signal electrode S11B have a shape extending along the extending direction of the insulating resin layer Ly2. The signal electrode S11A and the signal electrode S11B include a bent portion so as not to overlap with the recess 122L and the inflow port connected to the recess 122L in plan view. The ground electrode 130 is provided over the entirety or substantially the entirety of the back surface of the insulating resin layer Ly2 excluding a region of the signal electrode S11A and the signal electrode S11B, and is separated from the signal electrode S11A and the signal electrode S11B. The ground electrode 130 provided on the back surface of the insulating resin layer Ly2 and the ground electrode 130 provided on the front surface of the insulating resin layer Ly1 are connected to each other via a plurality of interlayer connection electrodes 140.

The ground electrode 130 is provided over the entirety or substantially the entirety of the back surface of the insulating resin layer Ly3. The ground electrode 130 provided on the back surface of the insulating resin layer Ly3 and the ground electrode 130 provided on the back surface of the insulating resin layer Ly2 are connected to each other via a plurality of interlayer connection electrodes 140.

With the signal electrode S11 and the signal electrode S12S thus not overlapping with the recess 122L and the inflow port connected to the recess 122L in plan view, stable characteristic impedance of a strip line including the signal electrode S11 and stabilized impedance of a strip line including the signal electrode S12 can be achieved. Furthermore, with this configuration, external noise is less likely to be imposed on the signal electrode S11A and the signal electrode S11B, which are susceptible to external noise, such that improvement of transmission characteristics can be achieved.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A circuit member joint structure comprising:
   a first circuit member including a first main surface on which a first mounting electrode is provided;
   a second circuit member including a second main surface on which a second mounting electrode is provided;
   conductive joining materials including a first conductive joining material with which the first mounting electrode and the second mounting electrode are joined to each other; and
   an insulating joining material with which an end portion of the first circuit member and an end portion of the second circuit member are joined to each other; wherein
   the first circuit member includes a first recess on the first main surface and is spaced away from the first mounting electrode;
   at least a portion of the insulating joining material is disposed in the first recess;
   the recess is included in an insulating layer on the first main surface of the first circuit member;
   no insulating joining material is provided between the conductive joining materials; and
   each of the first circuit member and the second circuit member is flexible.

2. The circuit member joint structure according to claim 1, wherein at least a portion of the insulating joining material is not in contact with the first conductive joining material.

3. The circuit member joint structure according to claim 2, wherein the insulating joining material is not in contact with the first conductive joining material.

4. The circuit member joint structure according to claim 1, wherein
   a first protective layer is provided on the first main surface;
   the first protective layer includes a first opening through which at least a portion of the first mounting electrode is exposed; and
   a depth of the first recess is greater than a depth of the first opening.

5. The circuit member joint structure according to claim 4, wherein
   the first mounting electrode and the first opening respectively include a plurality of first mounting electrodes and a plurality of first openings; and
   a distance between the first opening and the first recess is greater than a shortest one of intervals between the plurality of first openings.

6. The circuit member joint structure according to claim 4, wherein
   an area of the first opening is larger than an area of the first mounting electrode; and
   the first mounting electrode is provided in the first opening.

7. The circuit member joint structure according to claim 1, wherein an area of a bottom surface of the first recess is greater than an area of a bottom surface of the first opening.

8. The circuit member joint structure according to claim 1, wherein
   the first circuit member includes a bend portion; and
   the first recess is closer to the bend portion than the first mounting electrode is.

9. The circuit member joint structure according to claim 1, further comprising a first inflow port connected to the first recess and including at least a portion not overlapping with the second circuit member in plan view.

10. The circuit member joint structure according to claim 9, wherein a width of the first inflow port is smaller than a width of the first recess.

11. The circuit member joint structure according to claim 1, wherein
    the first recess includes a plurality of first recesses; and
    the plurality of first recesses sandwich the first mounting electrode.

12. The circuit member joint structure according to claim 11, wherein a direction in which the plurality of first recesses are arranged corresponds to a direction in which peeling stress is applied to a joint between the first circuit member and the second circuit member.

13. The circuit member joint structure according to claim 11, further comprising:

a first inflow port connected to one of the plurality of first recesses and including at least a portion not overlapping with the second circuit member in plan view; wherein the first mounting electrode includes a plurality of first mounting electrodes; and the first recess connected to the first inflow port and each of the first recesses not connected to the first inflow port are connected to each other through an auxiliary recess provided between a plurality of the first mounting electrodes.

14. The circuit member joint structure according to claim 1, wherein the first mounting electrode includes a plurality of first mounting electrodes; and the first recess is not provided in a mounting region in which the plurality of first mounting electrodes are provided.

15. The circuit member joint structure according to claim 1, wherein a melting point of the first conductive joining material is higher than a curing temperature of the insulating joining material.

16. The circuit member joint structure according to claim 15, wherein a main material of the first conductive joining material is solder; and a main material of the insulating joining material is epoxy resin.

17. The circuit member joint structure according to claim 1, wherein a Young's modulus of the insulating joining material is higher than a Young's modulus of the first circuit member.

18. The circuit member joint structure according to claim 1, wherein the first recess extends to a side surface of the first circuit member.

19. The circuit member joint structure according to claim 18, wherein the insulating joining material extends to the side surface of the first circuit member and a side surface of the second circuit member.

20. The circuit member joint structure according to claim 1, wherein the second circuit member includes a recess spaced away from the second mounting electrode, on the second main surface; and at least a portion of the insulating joining material is accommodated in the recess on the second main surface.

21. The circuit member joint structure according to claim 20, wherein the recess on the first main surface and the recess on the second main surface at least partially face each other.

22. The circuit member joint structure according to claim 20, further comprising a second inflow port connected to the second recess and including at least a portion not overlapping with the first circuit member in plan view.

23. The circuit member joint structure according to claim 22, wherein a width of the second inflow port is smaller than a width of the second recess.

24. The circuit member joint structure according to claim 1, wherein the second recess extends to a side surface of the second circuit member.

25. The circuit member joint structure according to claim 1, wherein the first circuit member includes a portion where the first main surface is curved.

26. The circuit member joint structure according to claim 1, wherein the second circuit member includes a portion where the second main surface is curved.

27. A circuit member joint structure comprising:

a first circuit member including a first main surface on which a first mounting electrode is provided;

a second circuit member including a second main surface on which a second mounting electrode is provided;

conductive joining materials including a first conductive joining material with which the first mounting electrode and the second mounting electrode are joined to each other; and an insulating joining material with which an end portion of the first circuit member and an end portion of the second circuit member are joined to each other; wherein the first circuit member includes a first recess on the first main surface and is spaced away from the first mounting electrode;

at least a portion of the insulating joining material is disposed in the first recess;

the recess is included in an insulating layer on the first main surface of the first circuit member;

no insulating joining material is provided between the conductive joining materials;

each of the first circuit member and the second circuit member is flexible; and a portion of each of the first circuit member and the second circuit member do not overlap one another in a direction that is orthogonal or substantially orthogonal to the first main surface.

* * * * *